(12) United States Patent
Bujard et al.

(10) Patent No.: US 8,177,901 B2
(45) Date of Patent: May 15, 2012

(54) POROUS INORGANIC MATERIALS OF SILCON AND OXYGEN

(75) Inventors: Patrice Bujard, Courtepin (CH); Andreas Mühlebach, Frick (CH); Paul Adriaan Van Der Schaaf, Hagenthal-le-Haut (FR)

(73) Assignee: BASF SE Ludwigshafen (DE)

( * ) Notice: Subject to any disclaimer, the term of this patent is extended or adjusted under 35 U.S.C. 154(b) by 485 days.

(21) Appl. No.: 12/536,522

(22) Filed: Aug. 6, 2009

(65) Prior Publication Data

US 2010/0003520 A1    Jan. 7, 2010

Related U.S. Application Data

(62) Division of application No. 10/542,850, filed as application No. PCT/EP2004/000137 on Jan. 12, 2004, now Pat. No. 7,594,962.

(30) Foreign Application Priority Data

| Jan. 17, 2003 | (EP) | 03405017 |
|---|---|---|
| Mar. 6, 2003 | (EP) | 03100548 |
| Jun. 16, 2003 | (WO) | PCT/EP03/50229 |

(51) Int. Cl.
| C04B 14/00 | (2006.01) |
|---|---|
| C04B 14/04 | (2006.01) |
| C23C 16/00 | (2006.01) |
| B01F 3/12 | (2006.01) |
| C01B 33/14 | (2006.01) |

(52) U.S. Cl. .............. 106/481; 106/400; 427/255.7; 516/34

(58) Field of Classification Search .......... 106/400, 106/481; 427/255.7, 249.15; 516/34, 81
See application file for complete search history.

(56) References Cited

U.S. PATENT DOCUMENTS

| 2,801,902 A | 8/1957 | Alexander .................. 23/182 |
|---|---|---|
| 3,681,017 A | 8/1972 | Butcher et al. ............... 23/182 |
| 4,230,765 A | 10/1980 | Takahashi et al. ........ 428/292.1 |
| 4,330,519 A | 5/1982 | Takahashi et al. ............. 423/335 |
| 4,913,966 A | 4/1990 | Garvey et al. ................. 428/402 |
| 6,054,206 A | 4/2000 | Mountsier .................. 428/312.8 |
| 6,096,148 A | 8/2000 | Kingma ........................ 156/107 |
| 6,096,418 A | 8/2000 | Sato et al. ...................... 428/323 |
| 6,174,512 B1 | 1/2001 | Kosuge et al. ................ 423/705 |
| 6,270,840 B1 | 8/2001 | Weinert ........................ 427/251 |
| 6,569,908 B2 | 5/2003 | Noguchi et al. |
| 2002/0052439 A1 | 5/2002 | Farooq ........................ 524/437 |
| 2003/0075079 A1 | 4/2003 | Sommer ...................... 106/442 |
| 2004/0131776 A1 | 7/2004 | Weinert .................... 427/255.7 |
| 2004/0261661 A1 | 12/2004 | Sommer ...................... 106/415 |
| 2005/0161678 A1 | 7/2005 | Weinert ........................ 257/77 |

FOREIGN PATENT DOCUMENTS

| DE | 100 04 888 | 8/2001 |
|---|---|---|
| EP | 0 325 484 | 7/1989 |
| EP | 1118584 A1 | 7/2001 |
| GB | 994404 | 6/1965 |
| GB | 1 511 125 | 5/1978 |
| JP | 63277582 A | 11/1988 |
| JP | 1123067 A | 5/1989 |
| WO | 00/24946 A1 | 5/2000 |
| WO | 0171394 A1 | 9/2001 |
| WO | 03/068868 | 8/2003 |

OTHER PUBLICATIONS

F.N. Dultsev et al., Jul. 1998, "Irregular Surface and Porous Structure of SiO2 Films Deposited at Low Temperature and Low Pressure" J. Electrochem. Soc., vol. 145, No. 7, pp. 2569-2572.
Advanced Materials, 2002, 14, No. 11, Jun. 5, pp. 830-833.
English Language Abstract of JP 1123067, May 16, 1989.
English Language Abstract of WO 0171394, Sep. 27, 2001.
English Language Abstract of JP 63277582, Nov. 15, 1988.

*Primary Examiner* — Anthony J Green
*Assistant Examiner* — Pegah Parvini
(74) *Attorney, Agent, or Firm* — Shiela A. Loggins

(57) ABSTRACT

The present invention relates to a process for the production of porous inorganic materials or a matrix material containing nanoparticles with high uniformity of thickness and/or high effective surface area and to the materials obtainable by this process. By the above-mentioned process materials with a defined thickness in the region of ±10%, preferably ±5% of the average thickness are available.

4 Claims, 2 Drawing Sheets

POROUS INORGANIC MATERIALS OF SILCON AND OXYGEN

Figure 1:
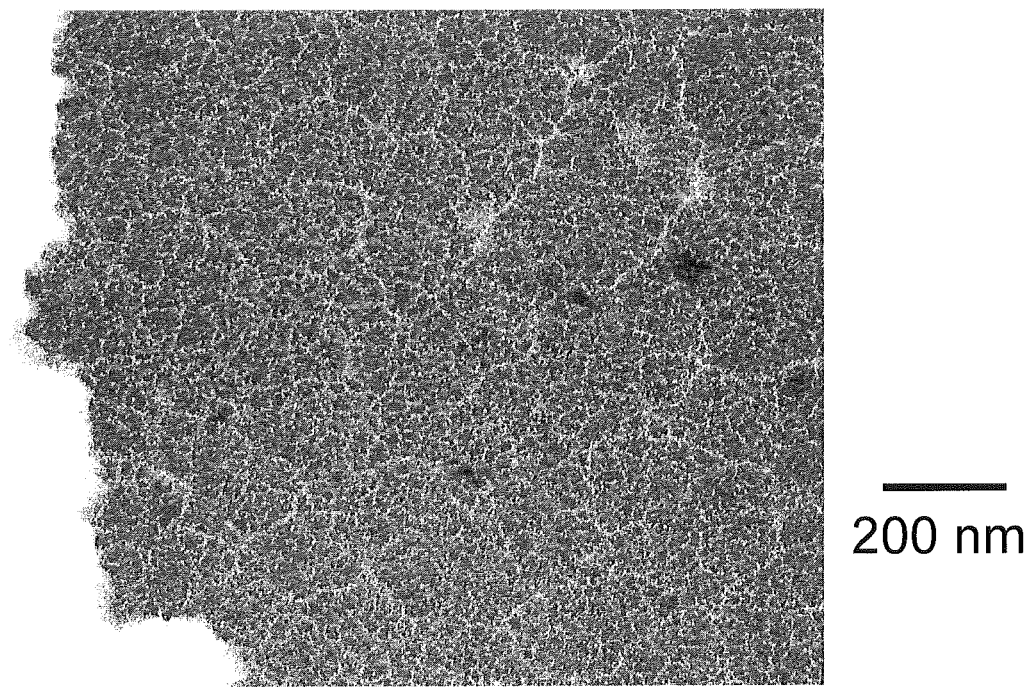

This application is a divisional of application Ser. No. 10/542,850, filed Jul. 12, 2005, now, U.S. Pat. No. 7,594,962 which is a 371 of PCT/EP2004/000137 filed on Jan. 12, 2004.

The present invention relates to a process for the production of porous inorganic materials or a matrix material containing nanoparticles with high uniformity of thickness and/or high effective surface area and to the materials obtainable by this process. By the above-mentioned process materials with a defined thickness in the region of ±10%, preferably ±5%, of the average thickness are available.

Monodisperse $SiO_2$ particles of spherical form are, for example, known from U.S. Pat. No. 3,634,588. They are obtained by hydrolytic polycondensation of alcoholate compounds.

U.S. Pat. No. 3,681,017 discloses a process for preparing microporous, platelet silica particles having a length to thickness ratio of at least 5.1 and a surface area of 400 to 500 $m^2/g$, which comprises
(a) forming an ammonium stabilized silicic acid solution,
(b) freezing said solution,
(c) thawing the effluent solution which contains platelet silica particles, and recovering said platelet silica particles.

EP-A-325484 relates to nacreous pigments based on metal-oxide-coated mica particles or other platy silicate particles which contain a dye or a color pigment. The nacreous pigments are obtained by (a) preparing a preliminary-stage product from platy silicate particles and a metal-oxide coating, b) leaching the thus obtained metal-oxide-coated particles with a mineral acid, possibly together with an oxidant, and c) dyeing of the thus produced metal-oxide-coated, porous particles, containing few or no cations, using at least one dye or one color pigment.

Highly mono-disperse, non-porous, spherical $SiO_2$ particles having a small particle size distribution are disclosed in EP-A-275668. These particles are produced by hydrolytic polycondensation of a sol or a suspension of primary particles of tetraalkoxy silanes in alkaline medium, which are brought to the desired final size by controlled addition of further tetraalkoxy silane.

The subsequent coating of the spherical $SiO_2$ particles is described in JP-A-06-011 872. WO01/57287 discloses a process for producing an interference pigment, wherein a metal oxide layer, especially a titanium oxide layer, a core layer, especially a silicon oxide layer and a metal oxide layer, especially a titanium oxide layer, are subsequently evaporated on a carrier, and then separated from the carrier.

DE-A-4341162 discloses a process for producing coloured layers comprising the simultaneous vapor-deposition of a non-absorbing material and an organic dye from different vaporizers on a substrate, such as glass, metal, ceramics, plastics etc.

EP-A-803 550 describes spherical $SiO_2$ particles with a size of from 5 to 500 nm coated at individual points with $TiO_2$, $Fe_2O_3$ or $ZrO_2$ particles with a size of less than 60 nm. The coated $SiO_2$ is prepared by adding a solution of $TiCl_4$ to an aqueous dispersion of the $SiO_2$ particles. The products obtained are used for pigmenting paints, printing inks, plastics and coatings or as sunscreen agents.

U.S. Pat. No. 6,103,209 describes a process for preparing porous spherical silica particles substantially consisting in emulsifying an acidic silica sol in a dispersing media, gelifying the microdrops of the sol in the emulsified state and submitting the resulting gel to thermal treatment in the presence of the emulsifier liquid and of sol gelation base.

U.S. Pat. No. 6,335,396 describes silica in the form of powder and substantially spherical beads or granules which are characterized by a CTAB specific surface of 140 and 240 $m^2/g$ and a porous distribution, the porous volume formed by the pores with a diameter of 175 to 275 Å being less than 50% of the porous volume formed by the pores with diameters of 400 Å or less. The silica may be used as reinforcing fillers for elastomers.

It is the object of the present invention to provide a process for the production of porous inorganic materials or a matrix material containing nanoparticles, especially porous silicon oxides, with high uniformity of thickness and/or high effective surface area, by which process materials with a high degree of plane parallelism and a defined thickness in the region of ±10%, preferably ±5%, of the average thickness and/or defined porosity can be produced.

Said object has been solved by a process for the production of porous materials, comprising the steps of:
a) vapor-deposition of a separating agent onto a carrier to produce a separating agent layer,
b) the simultaneous vapor-deposition of a material and a separating agent onto the separating agent layer (a),
c) the separation of the material from the separating agent.

The term "$SiO_y$ with $0.70 \leq y \leq 1.80$" means that the molar ratio of oxygen to silicon at the average value of the silicon oxide layer is from 0.70 to 1.80. The composition of the silicon oxide layer can be determined by ESCA (electron spectroscopy for chemical analysis).

The term "$SiO_z$ with $0.70 \leq z \leq 2.0$" means that the molar ratio of oxygen to silicon at the average value of the silicon oxide layer is from 0.70 to 2.0. The composition of the silicon oxide layer can be determined by ESCA (electron spectroscopy for chemical analysis).

According to the present invention the term "aluminum" comprises aluminum and alloys of aluminum. Alloys of aluminum are, for example described in G. Wassermann in Ullmanns Enzyklopädie der Industriellen Chemie, 4. Auflage, Verlag Chemie, Weinheim, Band 7, p. 281 to 292. Especially suitable are the corrosion stable aluminum alloys described on page 10 to 12 of WO00/12634, which comprise besides of aluminum silicon, magnesium, manganese, copper, zinc, nickel, vanadium, lead, antimony, tin, cadmium, bismuth, titanium, chromium and/or iron in amounts of less than 20% by weight, preferably less than 10% by weight.

The term "silicon/silicon oxide layer or flakes" comprises plane-parallel structures obtainable by heating plane-parallel structures of $SiO_y$ in an oxygen-free atmosphere at a temperature above 400° C. and optionally an oxidative heat treatment.

The present invention is directed to porous plate-like (plane-parallel) structures (flakes), in particular $SiO_z$ flakes whose particles have a length of from 1 μm to 5 mm, a width of from 1 μm to 2 mm, and a thickness of from 20 nm to 1.5 μm, and a ratio of length to thickness of at least 2:1, the particles having two substantially parallel faces, the distance between which is the shortest axis of the particles. The porous $SiO_z$ flakes are mesoporous materials, i.e. have pore widths of ca. 2 to ca. 50 nm. The pores are randomly inter-connected in a three-dimensional way. So, when used as a catalyst or a support, the passage blockage, which frequently occurs in $SiO_2$ flakes having a two-dimensional arrangement of pores can be prevented. Preferably, the porous $SiO_z$ flakes have a specific surface of greater than 500 $m^2/g$, especially greater than 600 $m^2/g$. The BET specific surface area is determined according to DIN 66131 or DIN 66132 (R. Haul und G. Dümbgen, Chem.-Ing.-Techn. 32 (1960) 349 and 35 (1063) 586) using the Brunauer-Emmet-Teller method (J. Am. Chem. Soc. 60 (1938) 309).

The flakes of the present invention are not of a uniform shape. Nevertheless, for purposes of brevity, the flakes will be referred to as having a "diameter." The silicon/silicon oxide flakes have a plane-parallelism and a defined thickness in the range of ±10%, especially ±5% of the average thickness. The silicon/silicon oxide flakes have a thickness of from 20 to 2000 nm, especially from 100 to 500 nm. It is presently preferred that the diameter of the flakes be in a preferred range of about 1-60 μm with a more preferred range of about 5-40 μm and a most preferred range of about 5-20 μm. Thus, the aspect ratio of the flakes of the present invention is in a preferred range of about 2.5 to 625 with a more preferred range of about 50 to 250.

According to the present invention the separating agent used for the separating agent layer can be different from the separating agent used for the layer comprising the material and the separating agent (mixed layer). Preferably the separating agent used in the separating agent layer and the mixed layer is identical. Removal of the separating agent is done preferably by dissolving the separating agent in a solvent and separation of the material from the solvent. Alternatively, an organic separating agent can be used, in particular, in the mixed layer, which can be distilled off under high vacuum at temperatures up to 250° C. Besides the suitable organic separating agents mentioned below, organic pigments, like phthalocyanines, diketopyrrolopyrroles, quinacridones etc. are suitable.

The platelike material can be produced in a variety of distinctable and reproducible variants by changing only two process parameters: the thickness of the mixed layer of material and separating agent and the amount of the material contained in the mixed layer.

In addition, the present invention is also directed to the porous platelike materials, in particular $SiO_z$ flakes, obtainable by the above process, wherein $0.70 \leq z \leq 2.0$, especially $1.4 \leq z \leq 2.0$, very especially $z=2.0$ as well as porous $SiO_z$ flakes, wherein $0.70 \leq z \leq 2.0$, especially $0.95 \leq z \leq 2.0$, very especially $z=2.0$.

FIG. 1 is a microphotograph of the porous $SiO_2$ flakes obtained in example 1. Pores or better (nano) cavities are discernible. As evident from FIG. 2 these pores or cavities are not limited to the surface of the porous $SiO_2$ flakes.

Figure 2:
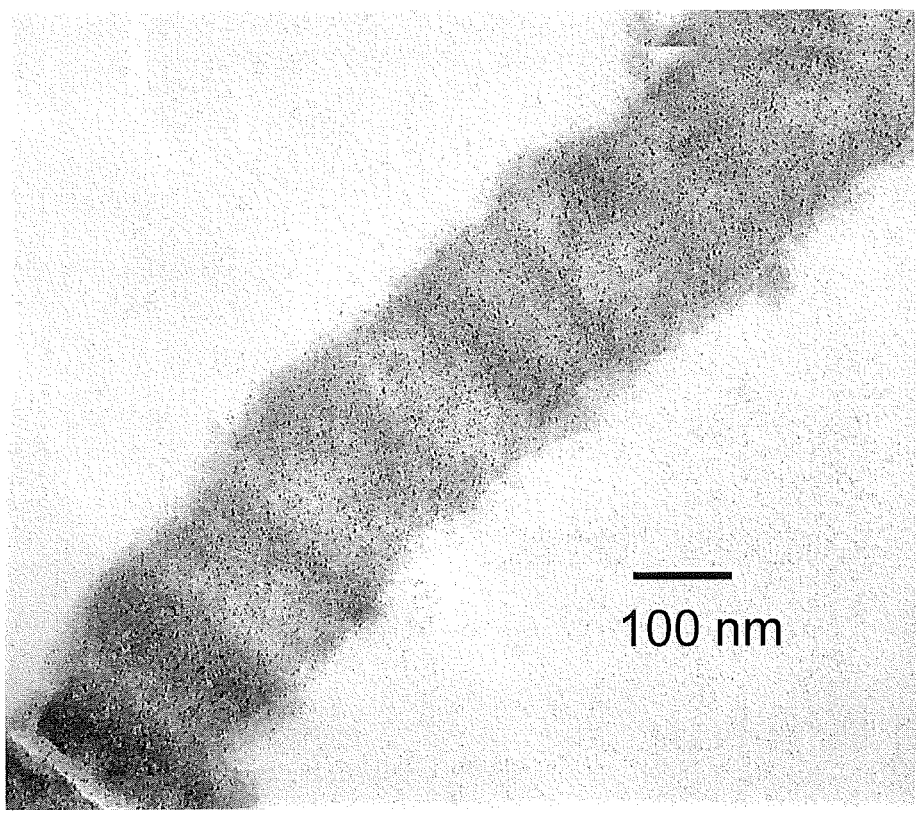

FIG. 2 is an ultrathin section of a porous $SiO_2$ flake loaded with palladium. The metal (black spots) is inside the flakes. The metal spot size is between 1 and 3 nm.

Figure 3:
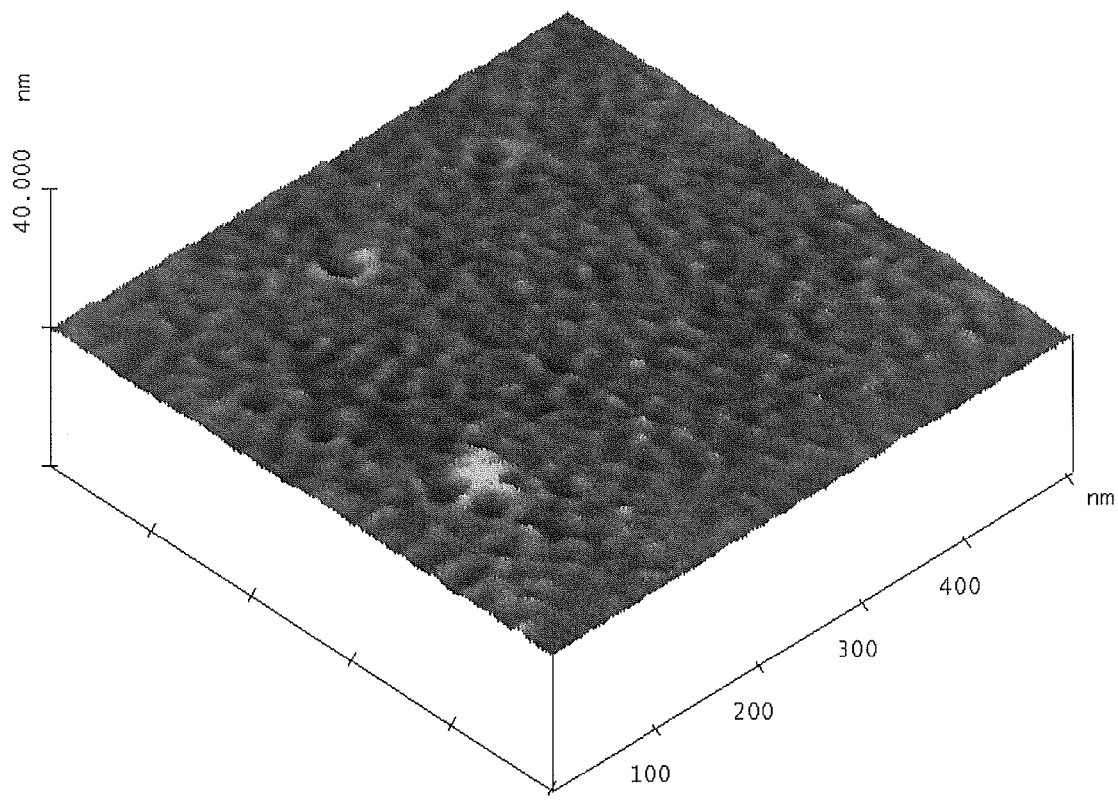

FIG. 3 shows an atomic force microscope (AFM) picture of the porous $SiO_2$ flakes of example 1. The pore sizes are up to 30 nm.

According to the present invention the porous platelike material is produced by depositing a mixed layer of material/separating agent on a separating agent layer. By controlling the amount of separating agent in the mixed layer the porosity of the material can be controlled in a simple manner.

The mixed layer and the separating agent layer are vapor-deposited in vacuo, wherein the separating agent is mixed with the material by simultaneous vapor-deposition in vacuo. In general, the mixed layer contains the separating agent in an amount of 1 to 60% by weight based on the total weight of material and separating agent.

The (porous) material is preferably a metal or a metal oxide or a non-metal oxide or a mixture thereof. Most preferred the non-metal oxide is $SiO_z$ with $0.70 \leq z \leq 2.0$, especially $1.4 \leq z \leq 2.0$. The most preferred metal oxide is $TiO_2$.

In general, according to high-resolution electron microscopy the porous materials of the present invention have a pore diameter of less than 30 nm.

The production of the porous materials is done by vapor deposition technique. The substances to be vaporized are heated under a high vacuum and are vaporized. The vapors condense on the cold substrate surfaces, giving the desired thin layers. Vaporization takes place either in metal containers (boats of tungsten, molybdenum or tantalum metal sheet), which are heated directly by passage of a current, or by bombardment with electron beams.

In the case of the sputtering technique or in the case of cathode atomization, a gas discharge (plasma) is ignited between the substrate and coating material (target), which is in the form of plates. The coating material is bombarded with high-energy ions from the plasma, for example argon ions, and is thereby abraded or atomized. The atoms and molecules of the atomized coating material are deposited on the substrate and form the desired thin layer.

Metals or alloys are particularly suitable for sputtering techniques. They can be atomized at comparatively high rates, especially in the so-called DC magnetron process. Compounds such as oxides or suboxides or mixtures of oxides can likewise be atomized using high-frequency sputtering. The chemical composition of the layers is determined by the composition of the coating material (target). However, it can also be influenced by adding substances to the gas which forms the plasma. Oxide or nitride layers, in particular, are produced by addition of oxygen or nitrogen to the gas phase (see, for example, U.S. Pat. No. 5,440,446 und EP-A-733919).

The production is very simple, if the mixed layer is formed by two vaporizers, whose vapor beams overlap, so that the mixed layer is created in the overlapping area. Alternatively, the vapor deposition can be achieved using one vaporizer, which vaporizes both components simultaneously or alternately.

Preferably resistance heated evaporators, evaporators heated with electron beams, evaporators heated inductively or evaporators operated with an arc are used as evaporators.

For simplification of separation the carrier material should show a smooth or a structured surface. The movable carrier may consist of one or more discs, cylinders or other rotationally symmetrical bodies, which rotate about an axis (cf. WO01/25500), and consists preferably of one or more continuous metal belts with or without a polymeric coating or of one or more polyimide or polyethylene terephthalate belts, so that a continuous material manufacturing is allowed (DE19844357). A polyimide film or a film of metal or film of a combination of these materials are especially suitable as the carrier material.

The separating agent vapor-deposited onto the carrier in step a) may be a lacquer (surface coating), a polymer, such as, for example, the (thermoplastic) polymers, in particular acryl- or styrene polymers or mixtures thereof, as described in U.S. Pat. No. 6,398,999, an organic substance soluble in organic solvents or water and vaporizable in vacuo, such as anthracene, anthraquinone, acetamidophenol, acetylsalicylic acid, camphoric anhydride, benzimidazole, benzene-1,2,4-tricarboxylic acid, biphenyl-2,2-dicarboxylic acid, bis(4-hydroxyphenyl)sulfone, dihydroxyanthraquinone, hydantoin, 3-hydroxybenzoic acid, 8-hydroxyquinoline-5-sulfonic acid monohydrate, 4-hydroxycoumarin, 7-hydroxycoumarin, 3-hydroxynaphthalene-2-carboxylic acid, isophthalic acid, 4,4-methylene-bis-3-hydroxynaphthalene-2-carboxylic acid, naphthalene-1,8-dicarboxylic anhydride, phthalimide and its potassium salt, phenolphthalein, phenothiazine, saccharin and its salts, tetraphenylmethane, triphenylene, triphenylmethanol or a mixture of at least two of those substances.

The separating agent is preferably an inorganic salt soluble in water and vaporizable in vacuo (see, for example, DE 198 44 357), such as sodium chloride, potassium chloride, lithium chloride, sodium fluoride, potassium fluoride, lithium fluoride, calcium fluoride, sodium aluminum fluoride and disodium tetraborate.

Preferred embodiments of the present invention are described in more detail below:

The vapor-deposition in steps a) and b) is carried out preferably under a vacuum of <0.5 Pa. The dissolution of the separating agent layer in step c) is carried out at a pressure in the range preferably from 1 to $5 \times 10^4$ Pa, especially from 600 to $10^4$ Pa, and more especially from $10^3$ to $5 \times 10^3$ Pa.

In a preferred embodiment of the present invention the following layers are subsequently vapor-deposited under a vacuum of preferably $10^{-1}$ to $10^{-3}$ Pa, more preferably 1 to $10^{-3}$ Pa, by thermal evaporation according to the PVD technique:

a separating agent layer and a mixed layer of the material and the separating agent in the desired amount on top of the separating agent layer, which is incorporated into the material by simultaneous vapor-deposition using two vaporizers or alternatively one vaporizer.

In principle, every inorganic material can be used in the process according to the present invention, which is processable under the conditions of the inventive process. Metals, metal oxides and/or non-metal oxides are preferably used.

If the material is a metal oxide, it is preferably selected from the group selected from titanium suboxides, zirconium monoxide, niobium oxide, cerium-metal (treatment in air results in $CeO_2$), such as commercial available cerium mixed metal.

If the material is a metal, metals, such as aluminum, nickel, iron, cobalt, silver, chromium, zirconium, niobium, molybdenum, vanadium, titanium or alloys, such as chromium-nickel, iron-nickel, iron-chromium, nickel-cobalt etc. are preferred. The evaporation of alloys is practically carried out using different vaporizers and by maintaining the desired mol ratio.

A particular preferred embodiment of the present invention is directed to the production of porous $SiO_z$ flakes: A salt, for example NaCl, followed successively by a layer of silicon suboxide ($SiO_y$) and separating agent, especially NaCl or an organic separating agent, is vapor-deposited onto a carrier, which may be a continuous metal belt, passing by way of the vaporizers under a vacuum of <0.5 Pa.

The mixed layer of silicon suboxide ($SiO_y$) and separating agent is vapor-deposited by two distinct vaporizers, which are each charged with one of the two materials and whose vapor beams overlap, wherein the separating agent is contained in the mixed layer in an amount of 1 to 60% by weight based on the total weight of the mixed layer.

The thicknesses of salt vapor-deposited are about 20 nm to 100 nm, especially 30 to 60 nm, those of the mixed layer from 20 to 2000 nm, especially 50 to 500 nm depending upon the intended purpose of the product.

On its further course, the belt-form carrier, which is closed to form a loop, runs through dynamic vacuum lock chambers of known mode of construction (cf. U.S. Pat. No. 6,270,840) into a region of from 1 to $5 \times 10^4$ Pa pressure, preferably from 600 to $10^4$ Pa pressure, and especially from $10^3$ to $5 \times 10^3$ Pa pressure, where it is immersed in a dissolution bath. The temperature of the solvent should be so selected that its vapor pressure is in the indicated pressure range. With mechanical assistance, the separating agent layer and if the separating agent of the mixed layer is similar to the separating agent of the separating agent layer, the separating agent contained in the $SiO_z$ layer rapidly dissolves and the product layer breaks up into flakes, which are then present in the solvent in the form of a suspension. If two different separating agents are used, the step of dissolving the separating agent of the separating agent layer is followed by the step of dissolving the separating agent of the mixed layer. In a preferred embodiment the separating agent of the separating agent layer is NaCl and the separating agent of the mixed layer is an organic separating agent, such as phenolphthalein, wherein the NaCl is dissolved in water or aqueous solutions (for example hydrochloric acid) and the organic separating agent is dissolved in an organic solvent, like iso-propanol, or sublimed. On its further course, the belt is dried and freed from any contaminants still adhering to it. It runs through a second group of dynamic vacuum lock chambers back into the vaporization chamber, where the process of coating with separating agent and product layer of $SiO_y$/separating agent is repeated.

The suspension then present in both cases, comprising product structures and solvent, and the separating agent dissolved therein, is then separated in a further operation in accordance with a known technique. For that purpose, the product structures are first concentrated in the liquid and rinsed several times with fresh solvent in order to wash out the dissolved separating agent. The product, in the form of a solid that is still wet, is then separated off by filtration, sedimentation, centrifugation, decanting or evaporation.

A $SiO_{1.00-1.8}$ layer is formed preferably from silicon monoxide vapour produced in the vaporiser by reaction of a mixture of Si and $SiO_2$ at temperatures of more than 1300° C.

A $SiO_{0.70-0.99}$ layer is formed preferably by evaporating silicon monoxide containing silicon in an amount up to 20% by weight at temperatures of more than 1300° C.

The production of porous $SiO_z$ flakes with z>1 can be achieved by providing additional oxygen during the evaporation. For this purpose the vacuum chamber can be provided with a gas inlet, by which the oxygen partial pressure in the vacuum chamber can be controlled to a constant value.

Alternatively, after drying, the product can be subjected to oxidative heat treatment. Known methods are available for that purpose. Air or some other oxygen-containing gas is passed through the plane-parallel structures of $SiO_y$, wherein y is, depending on the vapor-deposition conditions, from 0.70, especially 1 to about 1.8, which are in the form of loose material or in a fluidized bed, at a temperature of more than 200° C., preferably more than 400° C. and especially from 500 to 1000° C. After several hours all the structures will have been oxidised to $SiO_2$. The product can then be brought to the desired particle size by means of grinding or air-sieving and delivered for further use.

The porous $SiO_z$ flakes should have a minimum thickness of 50 nm, to be processable. The maximum thickness is dependent on the desired application. For applications, in which interference plays an important role, the thickness is in the range of from 150 to 500 nm.

In order to achieve orientation of the porous plane-parallel structures of silicon dioxide approximately parallel to the surface of the surface coating layer(s), the surface tension of the structures can be modified by adding known chemicals to the surface coating, for example by means of commercially available silane oligomers. Such oligomers, known under the trade names DYNASILAN™, HYDROSIL™, PROTECTO-SIL™ can also be deposited directly onto the surface of the plane-parallel structures, either from a liquid phase or by condensation, before the latter are introduced into the surface coating. Because such organic oligomers have only limited temperature resistance, it has proved advantageous to carry out such treatment only after oxidation to $SiO_2$ has taken place, at temperatures from 0° to 250° C.

The porous plane-parallel structures of silicon dioxide can be incorporated into a surface coating or dispersion layer for increasing the resistance to abrasion (scratch resistance) and resistance to impact of the surface of such a surface coating or dispersion.

In addition, the surface of the porous plane-parallel structures of silicon dioxide can be rendered hydrophobic by derivatization with typical silane coupling agents having the formula $ClSiX^1X^2X^3$, wherein $X^1$, $X^2$ and $X^3$ represent organic groups and can be the same or different. Alternatively, the silica surface can be alkylated by first chlorinating the silica surface using thionyl chloride and then metathesizing with alkyllithium to introduce alkyl groups and eliminate LiCl (J. D. Sunseri et al., Langmuir 19 (2003) 8608-8610).

In a further embodiment the present invention relates to porous platelike $SiO_{y+a}$ particles, containing (1−y/y+a) silicon, wherein $0.70 \leq y \leq 1.8$, especially $1.0 \leq y \leq 1.8$, $0.05 \leq a \leq 1.30$, and the sum of y and a is smaller or equal to 2.

Porous $SiO_{y+a}$ flakes, especially $SiO_2$ flakes containing (1−y/y+a) Si nanoparticles can be obtained by heating porous $SiO_y$ particles in an oxygen-free atmosphere, i.e. an argon or helium atmosphere or in a vacuum of less than 13 Pa ($10^{-1}$ Torr), at a temperature above 400° C., especially 400 to 1100° C.

It is assumed that by heating $SiO_y$ particles in an oxygen-free atmosphere, $SiO_y$ disproportionates in $SiO_2$ and Si:

$SiO_y \rightarrow (y/y+a)SiO_{y+a} + (1-y/y+a)Si$

In this disproportion porous $SiO_{y+a}$ flakes are formed, containing (1−(y/y+a)) Si, wherein $0.70 \leq y \leq 1.8$, especially $0.70 \leq y \leq 0.99$ or $1 \leq y \leq 1.8$, $0.05 \leq a \leq 1.30$, and the sum y and a is equal or less than 2. $SiO_{y+a}$ is an oxygen enriched silicon suboxide. The complete conversion of $SiO_y$ in Si and $SiO_2$ is preferred:

$SiO_y \rightarrow (y/2)SiO_2 + (1-(y/2))Si$

In the temperature range of from 400 to 900° C. the formed silicon is amorph. In the temperature range of from 900 to 1100° C. silicon crystallites are formed. The average crystallite size is in the range of from 1 to 20 nm, especially 2 to 10 nm. The size is on the one hand dependent on the temperature. That is, at 1100° C. larger crystallites than at 900° C. are formed. On the other hand a clear tendency for the formation of smaller crystallites is found, the higher the oxygen level of the $SiO_y$ is. Depending on the preparation the Si containing, plane-parallel $SiO_{y+a}$ particles, especially $SiO_2$ particles can show photoluminescence.

The porous silicon/silicon oxide flakes should have a minimum thickness of 50 nm, to be processable. The maximum thickness is dependent on the desired application. For applications, in which interference plays an important role, the thickness is in the range of from 150 to 500 nm.

The further layers necessary for interferences can be deposited in accordance with usual procedures known for effect pigments with mica and/or $SiO_2$ core, which will be described in more detail below by means of the porous $SiO_z$ flakes.

It is furthermore possible to convert plane-parallel structures of the porous $SiO_y$, starting from their surface, partially to silicon carbide (SiC) (in the context of the present Application, this procedure shall be referred to as "carburization"). For that purpose, the plane-parallel porous $SiO_y$ structures are caused to react in a gas-tight reactor heatable to a maximum of about 1500° C., preferably in the form of loose material, with a carbon-containing gas selected from alkynes, for example acetylene, alkanes, for example methane, alkenes, aromatic compounds or the like, and mixtures thereof optionally in admixture with an oxygen containing compound, such as, for example, aldehydes, ketones, water, carbon monoxide, carbon dioxide or the like, or mixtures thereof, at from 500 to 1500° C., preferably from 500 to 1000° C., and advantageously with the exclusion of oxygen. In order to temper the reaction, an inert gas, for example argon or helium, may be admixed with the carbon-containing gas. In such carburization, it is possible for all of the $SiO_y$ to be reacted to form SiC; preferably from 5 to 90% by weight of the $SiO_y$ are reacted to form SiC.

Consequently, the present invention relates also to plane-parallel structures (pigments) based on porous plane-parallel silicon oxide substrates having on their surface a layer comprising silicon carbide (SiC). The $SiO_y$-to-SiC reaction takes place starting from the surface of the plane-parallel structures and accordingly results in a gradient rather than a sharp transition. This means that, in that embodiment, the SiC-containing layer consists of (silicon/silicon oxide)$_a$ and (SiC)$_b$, wherein $0 \leq a < 1$ and $0 < b \leq 1$, with b being 1 and a being 0 close to the surface of the pigment and the amount of SiC approaching 0 close to the boundary with the silicon/silicon oxide substrate.

The remaining $SiO_y$ of the plane-parallel structures may be oxidized in a further step at a temperature of at least about 200° C. up to about 400° C. with an oxygen-containing gas, such as air.

After carbide formation has been terminated, it is possible, optionally, for residual $SiO_y$ still present in the plane-parallel structures to be converted into $SiO_2$ by oxidation with an oxygen-containing gas, such as air, at a temperature of at least 200° C. without destroying the SiC formed. Because of the large specific surface area of the plane-parallel structures, temperatures of about 400° C. should not, in this case, be exceeded in the presence of oxygen.

The porous (carburised) silicon oxide flakes having a preferred thickness in the range of from 50 to 2000 nm are novel and form a further subject of the present invention. They may be used, for example, as corrosion-resistant additives having a Mohs hardness of from 8 to 9 in coatings or as corrosion-resistant additives in coating compositions in order to obtain properties of selective reflection in the infra-red. In addition the porous (carburised) silicon oxide flakes can be used as substrates for interference pigments. The pigments are highly shear-stable and, in plastics, surface coatings or printing inks, result in high degrees of saturation and excellent fastness properties and also, in the case of interference pigments, a high degree of goniochromicity (see, for example PCT/EP03101323).

Owing to high chemical and thermal stabilities, large surface areas and good compatibilities with other materials, the porous silicon oxide flakes can be used for many purposes, such as, for example, in the fields of selective separation (M. Asaeda, S. Yamasaki, Separation of inorganic/organic gas mixtures by porous silica membranes, Sep. Purif. Technol. 25 (2001) 151-159), catalysis (H. Suquet, S. Chevalier, C. Marcilly, D. Barthomeuf, Preparation of porous materials by chemical activation of the Lanovermiculite, Clay Miner. 26 (1991) 49-60; Y. Deng, C. Lettmann, W. F. Maier, Leaching of amorphous V- and Ti-containing porous silica catalysts in liquid phase oxidation reactions, Appl. Catal. A 214 (2001) 31-45; M. O. Coppens, J. H. Sun, T. Maschmeyer, Synthesis of hierarchical porous silicas with a controlled pore size distribution at various length scales, Catal. Today 69 (2001) 331-335), dielectric materials (A. Jain, S. Rogojevic, S. Ponoth, N. Agarwal, I. Matthew, W. N. Gill, P. Persans, M.

Tomozawa, J. L. Plawsky, E. Simonyi, Porous silica materials as low-k dielectrics for electronic and optical interconnects, Thin Solid Films 398-399 (2001) 513-522, prosthetic materials (J. M. Gomez-Vega, M. Iyoshi, K. Y. Kim, A. Hozumi, H. Sugimura, O. Takai, Spin casted mesoporous silica coatings for medical applications, Thin Solid Films 398-399 (2001) 615-20), or the use of porous silica as gas adsorbents (K. Okada, A. Shimai, T. Takei, S. Hayashi, A. Yasumori, K. J. D. MacKenzie, Preparation of microporous silica from metakaolinite by selective leaching method, Microporous Mesoporous Mater. 21 (1998) 289-296), heavy metal ion adsorbents (B. Lee, Y. Kim, H. Lee, J. Yi, Synthesis of functionalized porous silicas via templating method as heavy metal ion adsorbents: the introduction of surface hydrophilicity onto the surface of adsorbents, Microporous Mesoporous Mater. 50 (2001) 77-90, molecular sieves (U.S. Pat. No. 5,958,368), as carrier for drug delivery exhibiting a delayed release effect (J. F. Chen, H. M. Ding, J. X. Wang, L. Shao, Biomaterials 25 (2004) 723-727), for the production of an electrokinetic microchannel battery (J. Yang, F. Lu, L. W. Kostiuk, D. Y. Kwok, J. Micromech. Microeng. 13 (2003) 963-970), and inorganic carriers for enzyme immobilization (F. He, R. X. Zhuo, L. J. Liu, D. B. Jin, J. Feng, X. L. Wang, Immobilized lipase on porous silica beads: preparation and application for enzymatic ring-opening polymerization of cyclic phosphate, Reactive Functional Polym. 47 (2001) 153-89), especially as carrier for catalytic systems, for example, for olefin polymerisation or Suzuki coupling, or as reinforcing fillers for elastomers, especially tires or silicon rubbers (see, for example, U.S. Pat. No. 6,335,396 and EP-A-407262).

The $SiO_z$ flakes appear to be ideal for supporting catalytic metals, such as copper or nickel based reforming catalysts, or palladium based catalysts for the Suzuki reaction. These particles have very high surface areas (~700 $m^2$/g), and nanoscale (2-50 nm) porosity.

In a particularly preferred embodiment of the present invention, the porous $SiO_z$ flakes are used in an ink-receptive layer of imagable media. Accordingly, the present invention also relates to an imagable media comprising a support and an ink-receptive layer containing porous $SiO_z$ flakes and a hydrophilic binder, wherein $0.70 \leq z \leq 2.0$, especially $1.40 \leq z \leq 2.0$.

In the present invention, a range of the total amount of the porous silica flakes to be used in the ink-receptive layer is preferably 2 to 30 $g/m^2$. The above-mentioned range is preferred in the points of ink-absorption property and strength of the ink-receptive layer.

As the support to be used in the present invention, there may be used plastic resin films such as polyethylene, polypropylene, polyvinyl chloride, diacetate resin, triacetate resin, cellophane, acrylic resin, polyethylene terephthalate, polyethylene naphthalate, etc., water resistance supports such as a resin-coated paper in which a polyolefin resin is laminated on the both surfaces of paper, or water-absorptive supports such as fine quality paper, art paper, coated paper, cast coated paper and the like. A water resistance support is preferably used. A thickness of these supports to be used is preferably in the range of about 50 to 250 μm.

To the ink-receptive layer of the present invention, a hydrophilic binder is added to maintain the characteristics as a film. As the hydrophilic binder to be used, those conventionally known various kinds of binders can be used, and a hydrophilic binder which has high transparency and gives high permeability of ink is preferably used. For using the hydrophilic binder, it is important that the hydrophilic binder does not clog the voids by swelling at the initial stage of permeation of ink. From this point of view, a hydrophilic binder having a relatively low swellability at around room temperature is preferably used. A particularly preferred hydrophilic binder is a completely or partially saponified polyvinyl alcohol or a cationic-modified polyvinyl alcohol.

Among the polyvinyl alcohols, particularly preferred is partially or completely saponified polyvinyl alcohol having a saponification degree of 80% or more. Polyvinyl alcohols having an average polymerization degree of 500 to 5000 are preferred.

Also, as the cationic-modified polyvinyl alcohol, there may be mentioned, for example, a polyvinyl alcohol having a primary to tertiary amino groups or a quaternary ammonium group at the main chain or side chain of the polyvinyl alcohol as disclosed in Japanese Provisional Patent Publication No. 10483/1986.

Also, other hydrophilic binder may be used in combination, but an amount thereof is preferably 20% by weight or less based on the amount of the polyvinyl alcohol.

In the ink-receptive layers according to the present invention, a weight ratio of the porous $SiO_2$ particles and the hydrophilic binder is preferably in the range of 60:40 to 92:8, more preferably 70:30 to 90:10.

In the ink-receptive layer of the present invention, other inorganic fine particles than porous silica flakes may be contained in an amount of about 30% by weight or less of the amount of the porous silica flakes.

In the present invention, it is preferred that the ink-receptive layer B contains fine particles having an average particle size of 3 to 10 μm. As the fine particles, inorganic or organic fine particles may be used, and preferably organic resin fine particles. By adding the above-mentioned fine particles to the ink-receptive layer B, uneven glossiness can be overcome when printing is carried out by using pigment ink.

Embodiments of the present invention are possible in which the ink receptive layer includes additional materials in particle and/or granule form. Examples of materials which may be suitable in some applications include calcium carbonate, fumed silica, precipitated silica alumina, alkyl quaternary ammonium bentonite, alkyl quaternary ammonium montmorillonite, clay, kaolin, talcum, titanium oxide, chalk, bentonite, aluminum silicate calcium silicate, magnesium carbonate, calcium sulfate, barium sulfate, silicium oxide barium carbonate, boehmite, pseudo boehmite, aluminum oxide, aluminum hydroxide diatomaceous earth, calcined clay, and the like. Additional particles may serve various functions including ink retention. Examples of particle functions include pigmentation filling, lubricating, ultraviolet light absorption, whitening, heat stabilizing, and the like.

As the above-mentioned organic resin fine particles, there may be mentioned, for example, olefin homopolymer or copolymer such as polyethylene, polypropylene, polyisobutyrene, polyethylene oxide, polytetrafluoroethylene, polystyrene, ethylene-(meth)acrylic acid copolymer, ethylene-(meth)acrylate copolymer, ethylene-vinyl acetate copolymer and the like or a derivative thereof, polyvinyl chloride, vinyl chloride-vinyl acetate copolymer, vinyl chloride-(meth)acrylate copolymer, polyvinylidene chloride, styrene-butadiene rubber, NBR rubber and the like, singly or in admixture thereof. Incidentally, (meth)acrylic acid or (meth)acrylate herein means acrylic acid and/or methacrylic acid, or acrylate and/or methacrylate.

The respective layers of the ink-receptive layers according to the present invention may preferably contain a cationic compound for the purpose of improving water resistance. As the cationic compounds, there may be mentioned a cationic polymer and a water-soluble metallic compound. As the cationic polymer, there may be preferably mentioned polyethyleneimine, polydiallylamine, polyallylamine, polyalkylamine, as well as polymers having a primary to tertiary amino group or a quaternary ammonium salt group. The molecular weight (a weight average molecular weight; Mw) of these cationic polymers is preferably about 5,000 to about 100,000.

As the water-soluble metallic compound to be used in the present invention, there may be mentioned, for example, a water-soluble polyvalent metallic salt. There may be mentioned a water-soluble salt of a metal selected from the group consisting of calcium, barium, manganese, copper, cobalt, nickel, aluminum, iron, zinc, zirconium, titanium, chromium, magnesium, tungsten, and molybdenum. More specifically, there may be mentioned, for example, calcium acetate, calcium chloride, calcium formate, calcium sulfate, barium acetate, barium sulfate, barium phosphate, manganese chloride, manganese acetate, manganese formate dehydrate, ammonium manganese sulfate hexahydrate, cupric chloride, copper (II) ammonium chloride dihydrate, copper sulfate, cobalt chloride, cobalt thiocyanate, cobalt sulfate, nickel sulfate hexahydrate, nickel chloride hexahydrate, nickel acetate tetrahydrate, ammonium nickel sulfate hexahydrate, amide nickel sulfate tetrahydrate, aluminum sulfate, aluminum sulfite, aluminum thiosulfate, poly(aluminum chloride), aluminum nitrate nonahydrate, aluminum chloride hexahydrate, ferrous bromide, ferrous chloride, ferric chloride, ferrous sulfate, ferric sulfate, zinc bromide, zinc chloride, zinc nitrate hexahydrate, zinc sulfate, titanium chloride, titanium sulfate, zirconium acetate, zirconium chloride, zirconium oxychloride octahydrate, zirconium hydroxychloride, zirconium nitrate, basic zirconium carbonate, zirconium hydroxide, zirconium lactate, ammonium zirconium carbonate, potassium zirconium carbonate, zirconium sulfate, zirconium fluoride, chromium acetate, chromium sulfate, magnesium sulfate, magnesium chloride hexahydrate, magnesium citrate nonahydrate, sodium phosphorus wolframate, tungsten sodium citrate, dodecawolframatophosphate n hydrate, dodecawolframatosilicate 26 hydrate, molybdenum chloride, dodecamolybdatephosphate n hydrate, etc. Of these, the zirconium type compounds having high transparency and water resistance improvement effects are preferably used.

The ink-receptive layers of the present invention may contain various kinds of oil droplets to improve brittleness of a film. As such oil droplets, there may be contained a hydrophobic high-boiling point organic solvent (for example, liquid paraffin, dioctyl phthalate, tricresyl phosphate, silicone oil, etc.) or polymer particles (for example, particles in which at least one of a polymerizable monomer such as styrene, butyl acrylate, divinyl benzene, butyl methacrylate, hydroxyethyl methacrylate, etc. is/are polymerized) each having a solubility in water at room temperature of 0.01% by weight or less. Such oil droplets can be used in an amount in the range of 10 to 50% by weight based on the amount of the hydrophilic binder, In the present invention, a cross-linking agent (hardening agent) of the hydrophilic binder may be used in the ink-receptive layers. Specific examples of the hardening agent may include an aldehyde type compound such formaldehyde and glutaraldehyde, a ketone compound such as diacetyl and chloropentanedione, bis(2-chloroethylurea)-2-hydroxy-4,6-dichloro-1,3,5-triazine, a compound having a reactive halogen as disclosed in U.S. Pat. No. 3,288,775, divinylsulfone, a compound having a reactive olefin as disclosed in U.S. Pat. No. 3,635,718, a N-methylol compound as disclosed in U.S. Pat. No. 2,732,316, an isocyanate compound as disclosed in U.S. Pat. No. 3,103,437, an aziridine compound as disclosed in U.S. Pat. Nos. 3,017,280 and 2,983,611, a carbodiimide type compound as disclosed in U.S. Pat. No. 3,100,704, an epoxy compound as disclosed in U.S. Pat. No. 3,091,537, a halogen carboxyaldehyde compound such as mucochloric acid, a dioxane derivative such as dihydroxydioxane, an inorganic hardening agent such as chromium alum, zirconium sulfate, boric acid and a borate, and they may be used singly or in combination of two or more.

Among the hardening agents as mentioned above, boric acid and a borate are particularly preferred. As the boric acid to be used in the present invention, orthoboric acid, metaboric acid, hypoboric acid, and the like may be mentioned, and as the borate, a sodium salt, a potassium salt, an ammonium salt thereof may be mentioned. A content of the boric acid or borate is preferably 0.5 to 80% by weight in the ink-receptive layer based on the amount of the polyvinyl alcohol.

In the present invention, to the respective layers of the ink-receptive layers, various kinds of conventionally known additives such as a coloring dye, a coloring pigment, a fixing agent of an ink dye, an UV absorber, an antioxidant, a dispersant of the pigment, an antifoaming agent, a leveling agent, an antiseptic agent, a fluorescent brightener, a viscosity stabilizer, a pH buffer, etc. may be added in addition to the hardening agent.

An imagable media in accordance with the present invention may be utilized to fabricate identification cards, driver's licenses, passports, and the like. In a preferred embodiment, the image receptive material is adapted to receive an image comprised of aqueous ink. In a particularly preferred embodiment, the image receptive material is adapted to receive an image comprised of aqueous pigmented ink adapted for use in an inkjet printer. A printed image in accordance with the present invention preferably includes one or more security indicia. Examples of security indicia that may be suitable in some applications include a picture of a human face, a representation of a human finger print, barcodes, and/or a representation of a cardholders signature.

Porous $SiO_z$ flakes, loaded with organic or inorganic pigments, result in transparent, easy dispersible particles. Inorganic pigments include; especially those selected from the group consisting of metal oxides, antimony yellow, lead chromate, lead chromate sulfate, lead molybdate, ultramarine blue, cobalt blue, manganese blue, chrome oxide green, hydrated chrome oxide green, cobalt green and metal sulfides, such as cerium or cadmium sulfide, cadmium sulfoselenides, zinc ferrite, bismuth vanadate and mixed metal oxides. Examples of organic pigments (and also substituted derivatives thereof that may be used are described, for example, in W. Herbst, K. Hunger, Industrielle Organische Pigmente, 2nd completely revised edition, VCH 1995: 1-aminoanthraquinone pigments: p. 503-511; anthraquinone pigments: p. 504-506, 513-521 and 521-530; anthrapyrimidine: p. 513-415; azo pigments: p. 219-324 and 380-398; azomethine pigments: p. 402-411; quinacridone pigments: p. 462-481; quinacridone quinone pigments: p. 467-468; quinophthalone pigments: p. 567-570; diketopyrrolopyrrole pigments: p. 570-574; dioxazine pigments: p. 531-538; flavanthrone pigments: p. 517-519, 521; indanthrone pigments: p. 515-517; isoindoline pigments: p. 413-429; isoindolinone pigments: p. 413-429; isoviolanthrene pigments: p. 528-530; perinone pigments: p. 482-492; perylene pigments: p. 482-496; phthalocyanine pigments: p. 431-460; pyranthrone pigments: p. 522-526; thioindigo pigments (indigo pigments): p. 497-500, it also being possible to use mixtures of such pigments, including solid solutions. The term pigment includes also luminescent materials. Such $SiO_z$ flakes can be obtained, for example, by mixing the $SiO_z$ flakes with the organic pigment in a medium in which the pigment is soluble, such as, for example, concentrated $H_2SO_4$, precipitating the pigment by addition of a medium, such as, for example, water, in which the pigment is insoluble, and isolating the pigmented $SiO_z$ flakes by filtration and drying. The porous $SiO_z$ flakes loaded with a pigment can be used for pigmenting a substrate, like, for example, a high-molecular weight organic material.

Preferably the porous $SiO_z$ flakes loaded with a pigment can be obtained by filling the pigment with a so-called latent pigment and conversion of the latent pigment in the pigment form. The pigmentation of porous materials with latent pigments and preferred latent pigments are, for example, described in EP-A-648770, EP-A-648817, EP-A-764628, EP-A-761772, EP-A-1086984, WO98/32802, WO00/63297 and PCT/EP03/10968.

The latent pigment generally has the following formula $A(B)_x$ (I) wherein
x is an integer from 1 to 8,
A is the radical of a chromophore of the quinacridone, anthraquinone, perylene, indigo, quinophthalone, indanthrone, isoindolinone, isoindoline, dioxazine, azo, phthalocyanine or diketopyrrolopyrrole series, which is linked to x groups B by one or more hetero atoms, those hetero atoms being selected from the group consisting of nitrogen, oxygen and sulfur and forming part of the radical A,
B is a group of the formula

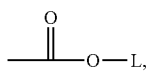

it being possible for the groups B, when x is a number from 2 to 8, to be the same or different, and
L is any desired group suitable for imparting solubility.
L is preferably a group of formula

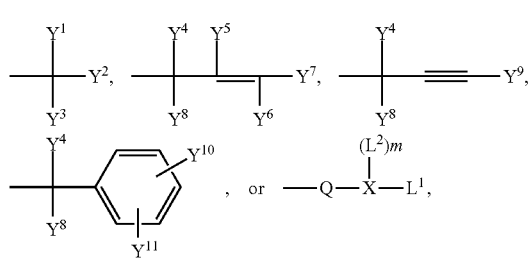

wherein $Y^1$, $Y^2$ and $Y^3$ are independently of each other $C_1$-$C_6$alkyl,
$Y^4$ and $Y^8$ are independently of each other $C_1$-$C_6$alkyl, $C_1$-$C_6$alkyl interrupted by oxygen, sulfur or $N(Y^{12})_2$, or unsubstituted or $C_1$-$C_6$alkyl-, $C_1$-$C_6$alkoxy-, halo-, cyano- or nitro-substituted phenyl or biphenyl,
$Y^5$, $Y^6$ and $Y^7$ are independently of each other hydrogen or $C_1$-$C_6$alkyl,
$Y^9$ is hydrogen, $C_1$-$C_6$alkyl or a group of formula

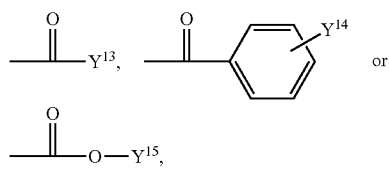

$Y^{10}$ and $Y^{11}$ are each independently of the other hydrogen, $C_1$-$C_6$alkyl, $C_1$-$C_6$alkoxy, halogen, cyano, nitro, $N(Y^{12})_2$, or unsubstituted or halo-, cyano-, nitro-, $C_1$-$C_6$alkyl- or $C_1$-$C_6$alkoxy-substituted phenyl,
$Y^{12}$ and $Y^{13}$ are $C_1$-$C_6$alkyl, $Y^{14}$ is hydrogen or $C_1$-$C_6$alkyl, and $Y^{15}$ is hydrogen, $C_1$-$C_6$alkyl, or unsubstituted or $C_1$-$C_6$alkyl-substituted phenyl,
Q is p, q-$C_2$-$C_6$alkylene unsubstituted or mono- or poly-substituted by $C_1$-$C_6$alkoxy, $C_1$-$C_6$alkylthio or $C_2$-$C_{12}$dialkylamino, wherein p and q are different position numbers,
X is a hetero atom selected from the group consisting of nitrogen, oxygen and sulfur, m being the number 0 when X is oxygen or sulfur and m being the number 1 when X is nitrogen, and
$L^1$ and $L^2$ are independently of each other unsubstituted or mono- or poly-$C_1$-$C_{12}$alkoxy-, —$C_1$-$C_{12}$alkylthio-, —$C_2$-$C_{24}$dialkylamino-, —$C_6$-$C_{12}$aryloxy-, —$C_6$-$C_{12}$arylthio-, —$C_7$-$C_{24}$alkylarylamino- or —$C_{12}$-$C_{24}$diarylamino-substituted $C_1$-$C_6$alkyl or [-(p',q'-$C_2$-$C_6$alkylene)-Z-]$_n$-$C_1$-$C_6$alkyl, n being a number from 1 to 1000, p' and q' being different position numbers, each Z independently of any others being a hetero atom oxygen, sulfur or $C_1$-$C_{12}$alkyl-substituted nitrogen, and it being possible for $C_2$-$C_6$alkylene in the repeating [-$C_2$-$C_6$alkylene-Z-] units to be the same or different,
and $L_1$ and $L_2$ may be saturated or unsaturated from one to ten times, may be uninterrupted or interrupted at any location by from 1 to 10 groups selected from the group consisting of —(C═O)— and —$C_6H_4$—, and may carry no further substituents or from 1 to 10 further substituents selected from the group consisting of halogen, cyano and nitro. Of special interest are compounds of formula (I) wherein L is $C_1$-$C_6$alkyl, $C_2$-$C_6$alkenyl or

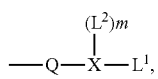

wherein Q is $C_2$-$C_4$alkylene, and
$L^1$ and $L^2$ are [—$C_2$-$C_{12}$alkylene-Z-]$_n$-$C_1$-$C_{12}$alkyl or is $C_1$-$C_{12}$alkyl mono- or poly-substituted by $C_1$-$C_{12}$alkoxy, $C_1$-$C_{12}$alkylthio or $C_2$-$C_{24}$dialkylamino, and m and n are as defined hereinbefore.

Of very special interest are compounds of formula (I) wherein L is $C_4$-$C_5$alkyl, $C_3$-$C_6$alkenyl or

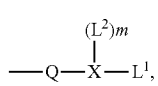

wherein Q is $C_2$-$C_4$alkylene, X is oxygen and m is zero, and $L^1$ is [—$C_2$-$C_{12}$alkylene-O-]$_n$—$C_1$-$C_{12}$alkyl or is $C_1$-$C_{12}$alkyl mono- or poly-substituted by $C_1$-$C_{12}$alkoxy, especially those wherein -Q-X— is a group of formula —$C(CH_3)_2$—$CH_2$—O—.

Examples of suitable compounds of formula (I) are disclosed in EP-A-0 648 770, EP-A-0 648 817, EP-A-0 742 255, EP-A-0 761 772, WO98/32802, WO98/45757, WO98/58027, WO99/01511, WO00/17275, WO00/39221, WO00/63297 and EP-A-1 086 984.

The pigment precursors may be used singly or also in mixtures with other pigment precursors or with colorants, for example customary dyes for the application in question.

A is the radical of known chromophores having the basic structure A(H)$_x$, wherein A preferably has, at each hetero atom linked to x groups B, at least one immediately adjacent or conjugated carbonyl group, such as, for example,
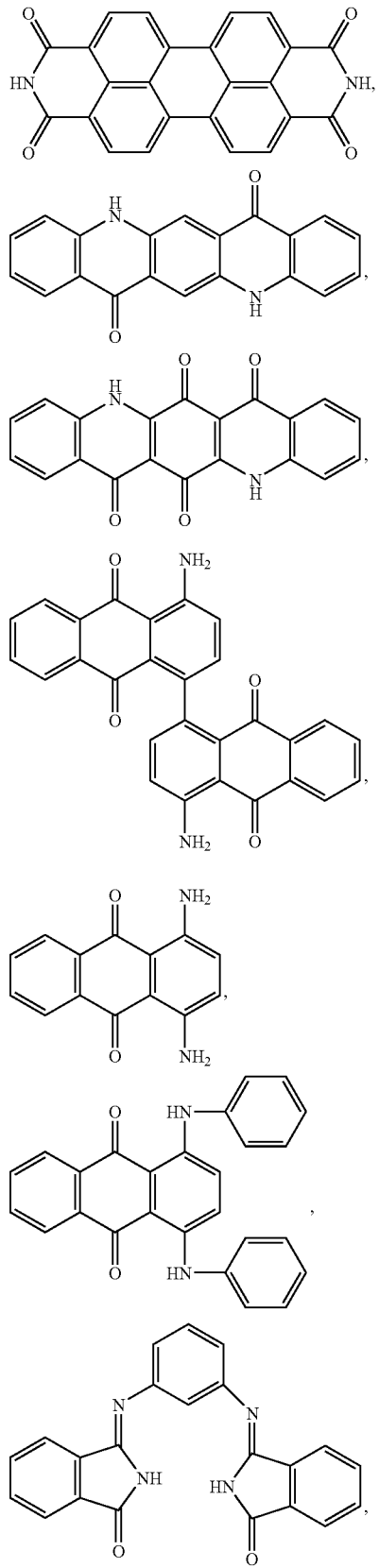
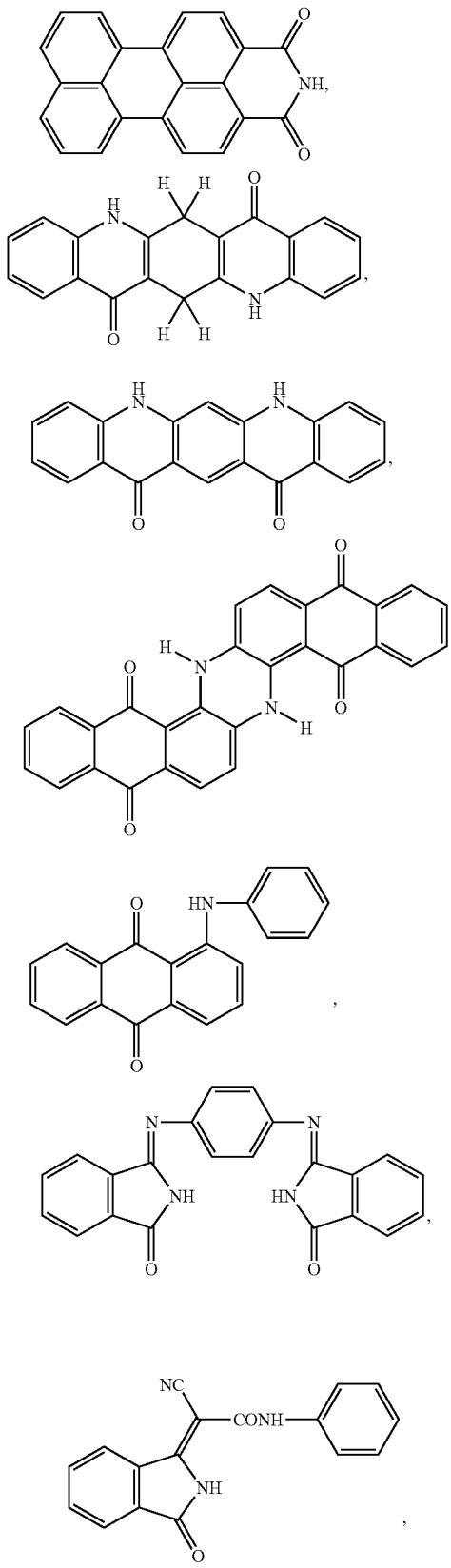

-continued
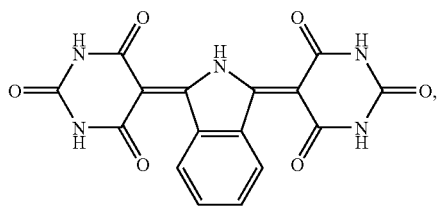
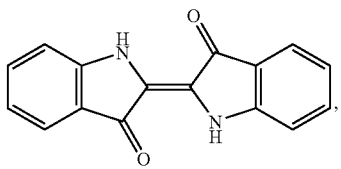
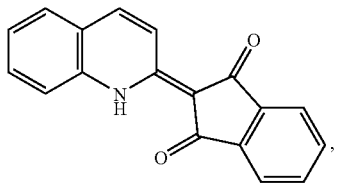
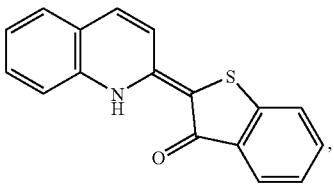
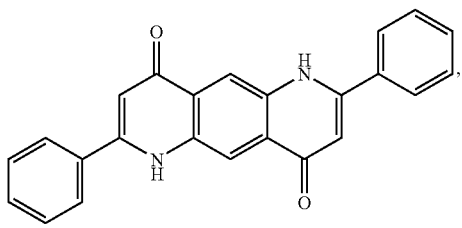
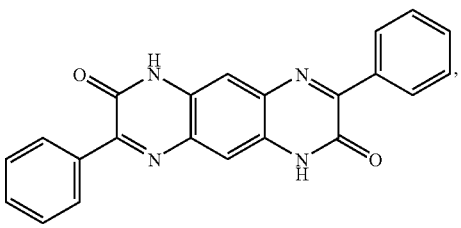
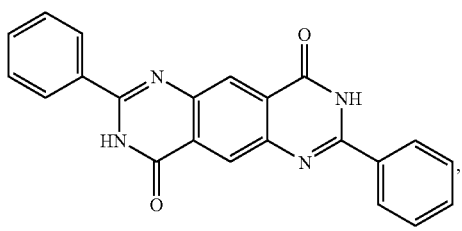
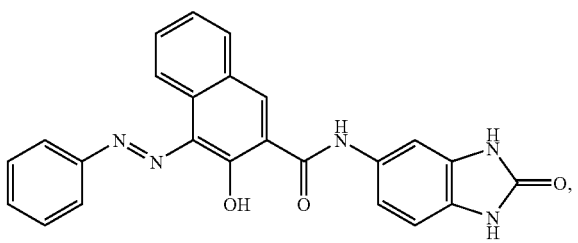
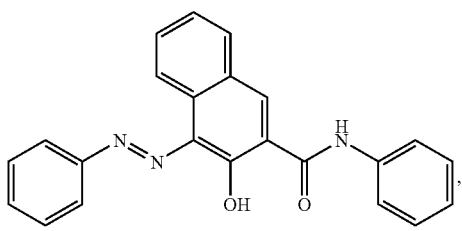
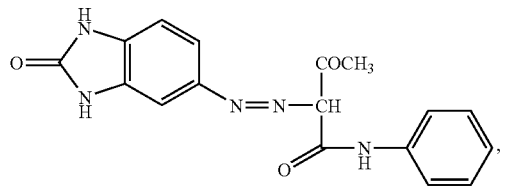
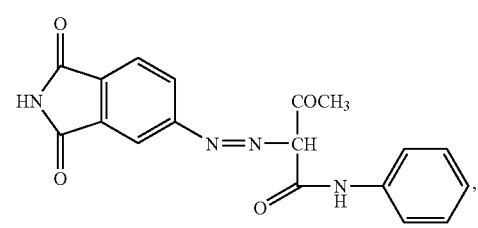
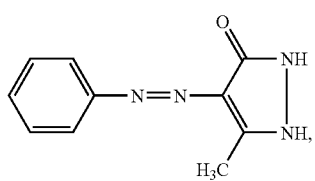
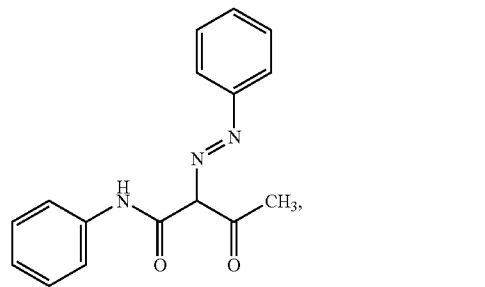

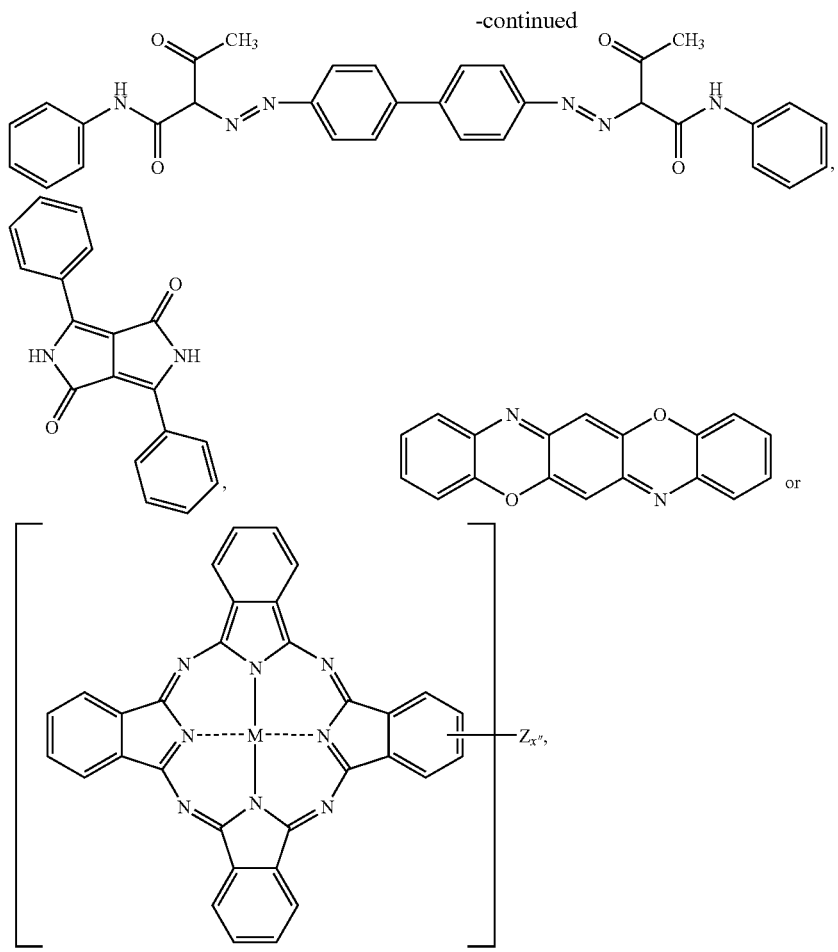

wherein, for example, Z is

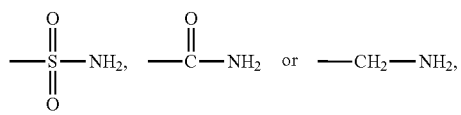

and x" is a number from 1 to 16, especially from 1 to 4;
and also, in each case, all known derivatives thereof.

Worthy of special mention are those soluble chromophores wherein the pigment of formula $A(H)_x$ is Colour Index Pigment Yellow 13, Pigment Yellow 73, Pigment Yellow 74, Pigment Yellow 83, Pigment Yellow 93, Pigment Yellow 94, Pigment Yellow 95, Pigment Yellow 109, Pigment Yellow 110, Pigment Yellow 120, Pigment Yellow 128, Pigment Yellow 139, Pigment Yellow 151, Pigment Yellow 154, Pigment Yellow 175, Pigment Yellow 180, Pigment Yellow 181, Pigment Yellow 185, Pigment Yellow 194, Pigment Orange 31, Pigment Orange 71, Pigment Orange 73, Pigment Red 122, Pigment Red 144, Pigment Red 166, Pigment Red 184, Pigment Red 185, Pigment Red 202, Pigment Red 214, Pigment Red 220, Pigment Red 221, Pigment Red 222, Pigment Red 242, Pigment Red 248, Pigment Red 254, Pigment Red 255, Pigment Red 262, Pigment Red 264, Pigment Brown 23, Pigment Brown 41, Pigment Brown 42, Pigment Blue 25, Pigment Blue 26, Pigment Blue 60, Pigment Blue 64, Pigment Violet 19, Pigment Violet 29, Pigment Violet 32, Pigment Violet 37, 3,6-di(4'-cyano-phenyl)-2,5-dihydro-pyrrolo[3,4-c]pyrrole-1,4-dione, 3,6-di(3,4-dichloro-phenyl)-2,5-dihydro-pyrrolo[3,4-c]pyrrole-1,4-dione or 3-phenyl-6-(4'-tert-butyl-phenyl)-2,5-dihydro-pyrrolo[3,4-c]pyrrole-1,4-dione. Further examples are described by Willy Herbst and Klaus Hunger in "Industrial Organic Pigments" (ISBN 3-527-28161-4, VCH/Weinheim 1993).

Alkyl or alkylene may be straight-chained, branched, monocylic or polycyclic.

$C_1$-$C_{12}$Alkyl is accordingly, for example, methyl, ethyl, n-propyl, isopropyl, n-butyl, sec-butyl, isobutyl, tert-butyl, cyclobutyl, n-pentyl, 2-pentyl, 3-pentyl, 2,2-dimethylpropyl, cyclopentyl, cyclohexyl, n-hexyl, n-octyl, 1,1,3,3-tetramethylbutyl, 2-ethylhexyl, nonyl, trimethylcyclohexyl, decyl, menthyl, thujyl, bornyl, 1-adamantyl, 2-adamantyl or dodecyl.

When $C_2$-$C_{12}$alkyl is mono- or poly-unsaturated, it is $C_2$-$C_{12}$alkenyl, $C_2$-$C_{12}$alkynyl, $C_2$-$C_{12}$alkapolyenyl or $C_2$-$C_{12}$alkapolyynyl, it being possible for two or more double bonds to be, where appropriate, isolated or conjugated, such as, for example, vinyl, allyl, 2-propen-2-yl, 2-buten-1-yl, 3-buten-1-yl, 1,3-butadien-2-yl, 2-cyclobuten-1-yl, 2-penten-1-yl, 3-penten-2-yl, 2-methyl-1-buten-3-yl, 2-methyl-3-buten-2-yl, 3-methyl-2-buten-1-yl, 1,4-pentadien-3-yl, 2-cyclopenten-1-yl, 2-cyclohexen-1-yl, 3-cyclohexen-1-yl, 2,4-cyclohexadien-1-yl, 1-p-menthen-8-yl, 4(10)-thujen-10-yl, 2-norbornen-1-yl, 2,5-norbornadien-1-yl, 7,7-dimethyl-2,4-norcaradien-3-yl and the various isomers of hexenyl, octenyl, nonenyl, decenyl and dodecenyl.

$C_2$-$C_4$Alkylene is, for example, 1,2-ethylene, 1,2-propylene, 1,3-propylene, 1,2-butylene, 1,3-butylene, 2,3-butylene, 1,4-butylene and 2-methyl-1,2-propylene. $C_5$-$C_{12}$Alkylene is, for example, an isomer of pentylene, hexylene, octylene, decylene or dodecylene.

$C_1$-$C_{12}$Alkoxy is O—$C_1$-$C_{12}$alkyl, preferably O—$C_1$-$C_4$alkyl.

$C_6$-$C_{12}$Aryloxy is O—$C_1$-$C_{12}$aryl, for example phenoxy or naphthyloxy, preferably phenoxy.

$C_1$-$C_{12}$Alkylthio is S—$C_1$-$C_{12}$alkyl, preferably S—$C_1$-$C_4$alkyl.

$C_6$-$C_{12}$Arylthio is S—$C_6$-$C_{12}$aryl, for example phenylthio or naphthylthio, preferably phenylthio.

$C_2$-$C_{24}$-Dialkylamino is N(alkyl$_1$)(alkyl$_2$), the sum of the carbon atoms in the two groups alkyl$_1$ and alkyl$_2$ being from 2 to 24, preferably N($C_1$-$C_4$alkyl)-$C_1$-$C_4$alkyl.

$C_7$-$C_{24}$Alkylarylamino is N(alkyl$_1$)(aryl$_2$), the sum of the carbon atoms in the two groups alkyl$_1$ and aryl$_2$ being from 7 to 24, for example methylphenylamino, ethylnaphthylamino or butylphenanthrylamino, preferably methylphenylamino or ethylphenylamino.

$C_{12}$-$C_{24}$-Diarylamino is N(aryl$_1$)(aryl$_2$), the sum of the carbon atoms in the two groups aryl$_1$ and aryl$_2$ being from 12 to 24, for example diphenylamino or phenylnaphthylamino, preferably diphenylamino.

Halogen is chlorine, bromine, fluorine or iodine, preferably fluorine or chlorine, especially chlorine.

Preference is given to a method which comprises
a) adding the porous $SiO_z$ particles to a solution of a latent pigment,
b) precipitating the latent pigment onto the carrier particles, and
c) subsequently converting the latent pigment to the pigment (PCT/EP03/10968).

In a preferred embodiment, the latent pigment, for example

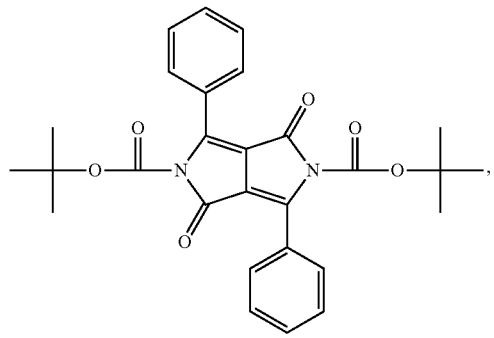

is first completely dissolved in an organic solvent, for example a mixture of THF and ethanol, at a temperature from 20° C. up to the boiling point of the solvent. The solvent is then added to a previously prepared suspension of the porous $SiO_z$ particles, in an organic solvent, for example ethanol, and stirred at a temperature from 20° C. up to the boiling point of the solvent for from 5 to 60 min. Then, within a period of from 10 to 120 min., with vigorous stirring, the solvent in which the latent pigment has poor solubility, normally water, is slowly added dropwise to the mixture, whereupon the latent pigment is deposited onto the carrier particles. Stirring is carried out for a further 10 to 120 minutes. The carrier particles coloured with the latent pigment are then filtered off, washed and dried.

Conversion of the pigment precursor into its pigmentary form is carried out by means of fragmentation under known conditions, for example thermally, optionally in the presence of an additional catalyst, for example the catalysts described in WO00/36210.

If the pores of the flakes are filled with organic pigment, interferences are observed, if the thickness of the flakes is in the range of from 200 to 500 nm, whereby the color of the pigment can be modified. If the pore size is smaller than 50 nm, the flakes loaded with the organic pigment are transparent.

The pores of the flakes can also be filled with inorganic pigments, such as, for example iron oxides, whereby black, yellow or red colors can be formed. Such flakes can be easily dispersed in organic binders. Dependent on the phase of the iron oxide the $SiO_z$ flakes loaded with iron oxide can be magnetic. $SiO_z$ flakes loaded with magnetic iron oxide, which have additionally been coated with Ag, can, for example be used for electromagnetic shielding.

Furthermore, the porous $SiO_z$ flakes, especially the pores of the flakes, can be covered with carbon, such as diamond-like carbon and amorphous carbon, by means of plasma supported deposition from the vapor phase by Plasma Enhanced Chemical Vapor Deposition (PECVD) or by means of magnetron sputtering (see, for example, U.S. Pat. No. 6,524,381). The plasma deposition can, for example, be carried out at room temperature and a pressure of 1 to 50 $10^3$ Pa making using argon as buffer or inert gas and methane, ethene or acetylene as process gas and optionally in the presence of a doping gas may occur.

Consequently, the present invention also relates to plane-parallel structures (pigments) based on porous $SiO_z$ substrates coated with carbon, especially diamond-like carbon. If the carbon is not only present in the pores, but also forms a layer, the thickness of the carbon layer is in the range of 10 to 150 nm.

Furthermore, the porous $SiO_z$ flakes, especially the pores of the flakes, can be filled with oxides of the elements titanium, iron, or zirconium.

The pores of the $SiO_z$ flakes show in this case a pore diameter of less than 30 nm, whereby highly translucent products with high absorption and reflection in the ultraviolet region are received. The particles can be obtained, for example, by adding a titanium tetrachloride solution to an aqueous dispersion of the $SiO_z$ flakes, separating the coated $SiO_z$ flakes, drying them and optionally calcinating them. It also exists the possibility, to produce nano $TiO_2$ of the rutile type with particle sizes between 1 to 50 nm by hydrolysis of $TiCl_4$ with hydrochloric acid at temperatures between 0 to 60° C. (R. J. Nussbaumer, W. Caseri, T. Tervoort and P. Smith, *Journal of Nanoparticle Research* 2002, 4, 319-323; Anpo et al. *J. Phys. Chem.* 1987, 91, 4305. It also exists the possibility, to produce nano $TiO_2$ of the anastase type with particle sizes between 10 to 40 nm by hydrolysis of Ti(OiPr)$_4$ (=titanium tetraisopropoxide) with water at 0 to 50° C. and subsequent removal of the formed isopropanol at temperatures between 50 to 100° C. and low vacuum (ca. 200 Torr) (crystallite size: <10 nm) (K. I. Gnanasekar et al. *Journal of Materials Research* 2002, 17(6), 1507-1512). A solution of titanic acid, produced from $TiCl_4$ by hydrolysis with ammonium hydroxide and subsequent oxidation with $H_2O_2$ can be added to a diluted solution of the $SiO_z$ flakes. By heating at 100 to 250° C., nano $TiO_2$ particles of the anatase type result spontaneously from this solution with particle sizes of approx. 10 nm (H. Ichinose, M. Terasaki and H. Katsuki, *Journal of the Ceramic Society of Japan, Int. Edition* 1996, 104(8), 715-718). Such solutions and dispersion are meanwhile also commercially available (Kon Corporation, 91-115 Miyano Yamauchi, Kishimagun Saga-prefecture, Japan 849-2305).

The SiO$_z$ flakes loaded with oxides of titanium, zirconia and iron can be coated with organic or inorganic compounds in accordance with known procedures. TiO$_2$ coated SiO$_z$ flakes can be used in media, where a high translucency is important, such as, for example, in varnishes, paints, plastics, or glass, and/or as a sun protective agent in cosmetics formulations. Furthermore the coated SiO$_z$ flakes can be used for the pigmentation of paints, printing inks, plastics and coatings (see, for example, EP-A-803550). SiO$_z$ flakes coated with TiO$_2$, especially TiO$_2$ of the anatase type, can have photocatalytic activity. Hence, such flakes exhibit self cleaning and disinfecting properties under exposure to UV radiation. These properties make the flakes a candidate for use in sterilization, sanitation, and remediation applications.

SiO$_z$ flakes covered with TiO$_2$ in the rutile modification can be used as highly efficient, translucent, little or hardly photoactive UV absorbers, e.g. in cosmetics (sun protective cremes), automobile or wood vanish etc. In addition to the UV protection such SiO$_z$ flakes also increase the scratch resistance and improve other physical properties, such as the modulus of elasticity.

According to the present invention the term "SiO$_z$ flakes coated with TiO$_2$ (or any other material)", or "SiO$_z$ flakes covered with TiO$_2$" includes that the whole surface of the SiO$_z$ flakes is coated with TiO$_2$, that the pores or parts of the pores of the SiO$_z$ flakes are filled with TiO$_2$ and/or that the SiO$_z$ flakes are coated at individual points with TiO$_2$.

If colours are desired, the colour effect of the pigments can generally be adjusted by way of
the thickness of the TiO$_2$ layer,
the thickness of the intermediate layer and
the composition of the intermediate layer.

TiO$_2$ coated SiO$_y$ flakes with $0.70 \leq y \leq 1.8$, especially $1.1 \leq y \leq 1.5$ can be, as described in PCT/EP03/50690, first calcined in a non-oxidising gas atmosphere at a temperature of more than 600° C., and the TiO$_2$ coated SiO$_y$ platelets are then treated, where appropriate, at a temperature of more than 200° C., preferably more than 400° C. and especially from 500 to 1000° C., with air or another oxygen-containing gas.

It is assumed that calcining TiO$_2$/SiO$_y$ in a non-oxidising atmosphere produces an intermediate layer that causes a change in the refractive index. However, the possibility that the intermediate layer is not a continuous layer and that, rather, only individual regions at the interface of TiO$_2$ and SiO$_y$ undergo a conversion that causes a change in the refractive index cannot be ruled out. It is further assumed that the change in the refractive index is due to the reduction of TiO$_2$ by SiO$_y$. The principle according to the invention is based, therefore, on producing, by reduction of TiO$_2$ with SiO$_y$, an intermediate layer that causes a change in the refractive index.

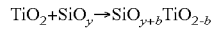

TiO$_2$+SiO$_y$→SiO$_{y+b}$TiO$_{2-b}$

If it is not intended to form the intermediate layer, the porous SiO$_y$ flakes must be oxidized to SiO$_2$ before coating with TiO$_2$. At present, it can not be excluded, that by heating TiO$_2$/SiO$_y$ particles in an oxygen-free atmosphere, i.e. an argon or helium atmosphere, or in a vacuum of less than 13 Pa ($10^{-1}$ Torr), at a temperature above 400° C., especially 400 to 1100° C., besides the reduction of TiO$_2$ by SiO$_y$, SiO$_y$ also disproportionates in SiO$_2$ and Si (PCT/EP03/50229).

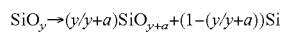

SiO$_y$→$(y/y+a)$SiO$_{y+a}$+$(1-(y/y+a))$Si

In this disproportion SiO$_{y+a}$ flakes are formed, containing $(1-(y/y+a))$ Si, wherein $0.70 \leq y \leq 0.99$ or $1.0 \leq y \leq 1.8$, $0.05 \leq a \leq 1.30$, especially $0.05 \leq a \leq 1.0$, and the sum y and a is equal or less than 2. SiO$_{y+a}$ is an oxygen enriched silicon suboxide.

If the SiO$_z$ flakes are loaded with donated materials, as for example tin-donated indium oxide, as described, for example in example 5 of WO02/31060, SiO$_z$ flakes with high IR absorbency can be obtained.

If the SiO$_z$ flakes are loaded with SnO$_2$, Sb$_2$O$_3$/SnO$_2$, In$_2$O$_3$ or In$_2$O$_3$/SnO$_2$ SiO$_z$ flakes with high IR reflecting power can be obtained (cf. U.S. Pat. No. 4,548,836).

For the production of interference pigments the process according to the present invention can be modified in such a manner, that between two mixed layers of material and separating agent further layers of metal, or metal oxide are deposited and/or in case of unsymmetrical layer structure of the pigment further layers of metal, or metal oxide are deposited before the mixed layer of material and separating agent.

Hence, the present invention also relates to platelike pigments, comprising a layer of porous material, especially SiO$_z$ with $0.70 \leq z \leq 2.0$.

Especially preferred are pigments, comprising
(a) a core of a metal, especially aluminum,
(b) optionally a SiO$_z$ layer on the core of aluminum and
(c) a layer of porous SiO$_z$ on the core of aluminum or the SiO$_z$ layer, wherein $0.70 \leq z \leq 2.0$, such as porous SiO$_z$/Al/porous SiO$_z$, porous SiO$_z$/SiO$_z$/Al/SiO$_z$/porous SiO$_z$, wherein unsymmetrical structures, such as porous SiO$_z$/Al/SiO$_z$, or SiO$_z$/Al/SiO$_z$/porous SiO$_z$, are less preferred.

The metal is preferably selected from Ag, Al, Au, Cu, Cr, Ge, Mo, Ni, Si, Ti, or the alloys thereof. Most preferred is Al.

The layer of porous SiO$_z$ (c) contains preferably an inorganic or organic coloring agent, such as a dye or an inorganic or organic pigment, especially an organic pigment.

In said embodiment pigments are particularly preferred, which comprise (in this order)
(c1) a layer of porous SiO$_z$ (thickness=40 to 60 nm, especially ca. 50 nm),
(b1) a SiO$_z$ layer (thickness=20 to 500 nm),
(a) a core of aluminum (thickness=40 to 60 nm, especially ca. 50 nm),
(b2) a SiO$_z$ layer (thickness=20 to 500 nm) and
(c2) a layer of porous SiO$_z$ (thickness=40 to 60 nm, especially ca. 50 nm), wherein $1.40 \leq z \leq 2.0$, especially 2.0, wherein layers (c1) and (c2) contains a dye or an inorganic or organic pigment, especially an organic pigment. Said pigments can optionally be coated with a protective layer of a material of low index of refraction, especially SiO$_2$. The pigments are characterized by a high chroma, which is caused by the combination of the absorption of the pigments incorporated in the porous layers and the interference colors of the pigments.

Further especially preferred pigments comprise (in this order)
(a) a layer of porous SiO$_z$;
(b) a SiO$_z$ layer and
(c) optionally a layer of porous SiO$_z$, wherein $0.70 \leq z \leq 2.0$, which are preferably coated by a wet-chemical method with a metal oxide having a high index of refraction, especially TiO$_2$. That is, the core of the pigments is formed by porous SiO$_z$/SiO$_z$ or porous SiO$_z$/SiO$_z$/porous SiO$_z$ flakes.

The porous SiO$_z$/SiO$_z$ flakes are prepared by a PVD process comprising the steps:
a) vapor-deposition of a separating agent onto a (movable) carrier to produce a separating agent layer,
b) vapor-deposition of a mixed layer of SiO$_y$ and separating agent onto the separating agent layer,
c) vapor-deposition of an SiO$_y$ layer onto the mixed layer, wherein $0.70 \leq y \leq 1.80$,
d) optionally vapor-deposition of a mixed layer of SiO$_y$ and separating agent onto the SiO$_y$ layer,
e) dissolution of the separating agent layer in a solvent, and f) separation of the obtained porous $SiO_z/SiO_z$ flakes from the solvent.

The pores of the porous layer can be filled with an organic pigment as described above, whereby it is possible to combine interference colors with the absorption of the pigments. Dependent on the layer thickness of the $SiO_z$ layer very high saturations can be obtained.

The porous $SiO_z$ flakes, especially $SiO_2$ flakes, whose effective refractive index is lower than that of $SiO_2$ (n=1.46) and is in the range of from 1.25-1.40 can be employed as substrates for interference pigments instead of $SiO_2$ flakes, or layered silicate flakes (e.g. mica, montmorillonite, saponite etc.).

Accordingly, the present invention is also directed to pigments, whose particles generally have a length of from 1 μm to 5 mm, a width of from 1 μm to 2 mm, and a thickness of from 50 nm to 1.5 μm, and a ratio of length to thickness of at least 2:1, wherein the particles have a core of porous $SiO_z$, porous $SiO_z/SiO_z$, $SiO_z$/porous $SiO_z/SiO_z$ or porous $SiO_z$/$SiO_z$/porous $SiO_z$ with $0.70 \leq z \leq 2.0$, especially $1.1 \leq z \leq 2.0$, very especially $1.4 \leq z \leq 2.0$ having two substantially parallel faces, the distance between which is the shortest axis of the core, comprising (a) a metal oxide of high index of refraction; or pigments, whose particles generally have a length of from 1 μm to 5 mm, a width of from 1 μm to 2 mm, and a thickness of from 50 nm to 1.5 μm, and a ratio of length to thickness of at least 2:1, wherein the particles have a core of porous $SiO_z$, porous $SiO_z/SiO_z$, $SiO_z$/porous $SiO_z/SiO_z$ or porous $SiO_z$/$SiO_z$/porous $SiO_z$ with $0.70 \leq z \leq 2.0$, especially $1.1 \leq z \leq 2.0$, very especially $1.4 \leq z \leq 2.0$ having two substantially parallel faces, the distance between which is the shortest axis of the core, comprising (a) a thin semitransparent metal layer.

Suitable metals for the semi-transparent metal layer are, for example, Cr, Ti, Mo, W, Al, Cu, Ag, Au, or Ni. The semi-transparent metal layer has typically a thickness of between 5 and 25 nm, especially between 5 and 15 nm. The $SiO_y$ substrates can have a metal layer only on one parallel face, but preferably the metal layer is present on both parallel faces of the substrate.

Alternatively the metal layer can be obtained by wet chemical coating or by chemical vapor deposition, for example, gas phase deposition of metal carbonyls. The substrate is suspended in an aqueous and/or organic solvent containing medium in the presence of a metal compound and is deposited onto the substrate by addition of a reducing agent. The metal compound is, for example, silver nitrate or nickel acetyl acetonate (WO03/37993).

According to U.S. Pat. No. 3,536,520 nickel chloride can be used as metal compound and hypophosphite can be used as reducing agent. According to EP-A-353544 the following compounds can be used as reducing agents for the wet chemical coating: aldehydes (formaldehyde, acetaldehyde, benzaldehyde), ketones (acetone), carbonic acids and salts thereof (tartaric acid, ascorbinic acid), reductones (isoascorbinic acid, triosereductone, reductinic acid), and reducing sugars (glucose).

If semi-transparent metal layers are desired, the thickness of the metal layer is generally between 5 and 25 nm, especially between 5 and 15 nm.

If pigments with metallic appearance (=opaque metal layer) are desired, the thickness of the metal layer is >25 nm to 100 nm, preferably 30 to 50 nm. If pigments with colored metal effects are desired, additional layers of colored or colorless metal oxides, metal nitrides, metal sulfides and/or metals can be deposited. These layers are transparent or semi-transparent. It is preferred that layers of high index of refraction and layers of low index of refraction alternate or that one layer is present, wherein within the layer the index of refraction is gradually changing. It is possible for the weathering resistance to be increased by means of an additional coating, which at the same time causes an optimal adaption to the binder system (EP-A-268918 and EP-A-632109). Porous $SiO_z$ flakes coated, for example, with Ag, or Ni are electrically conductive and can be used, for example, in the metallisation of hybrid microcircuits, solar cells, superconducting circuits and large area electronic structures by, for example, ink jet printing.

In one preferred embodiment of the present invention, the interference pigments comprise materials having a "high" index of refraction, which is defined herein as an index of refraction of greater than about 1.65, and optionally materials having a "low" index of refraction, which is defined herein as an index of refraction of about 1.65 or less. Various (dielectric) materials that can be utilized including inorganic materials such as metal oxides, metal suboxides, metal fluorides, metal oxyhalides, metal sulfides, metal chalcogenides, metal nitrides, metal oxynitrides, metal carbides, combinations thereof, and the like, as well as organic dielectric materials. These materials are readily available and easily applied by physical, or chemical vapor deposition processes, or by wet chemical coating processes.

In an especially preferred embodiment, the interference pigments on the basis of the porous silicon oxide substrate (includes porous $SiO_z$, porous $SiO_z/SiO_z$, $SiO_z$/porous $SiO_z$/$SiO_z$ as well as porous $SiO_z/SiO_z$/porous $SiO_z$) comprises a further layer of a dielectric material having a "high" refractive index, that is to say a refractive index greater than about 1.65, preferably greater than about 2.0, most preferred greater than about 2.2, which is applied to the entire surface of the silicon/silicon oxide substrate. Examples of such a dielectric material are zinc sulfide (ZnS), zinc oxide (ZnO), zirconium oxide ($ZrO_2$), titanium dioxide ($TiO_2$), carbon, indium oxide ($In_2O_3$), indium tin oxide (ITO), tantalum pentoxide ($Ta_2O_5$), chromium oxide ($Cr_2O_3$), cerium oxide ($CeO_2$), yttrium oxide ($Y_2O_3$), europium oxide ($Eu_2O_3$), iron oxides such as iron(II)/iron(III) oxide ($Fe_3O_4$) and iron(III) oxide ($Fe_2O_3$), hafnium nitride (HfN), hafnium carbide (HfC), hafnium oxide ($HfO_2$), lanthanum oxide ($La_2O_3$), magnesium oxide (MgO), neodymium oxide ($Nd_2O_3$), praseodymium oxide ($Pr_6O_{11}$), samarium oxide ($Sm_2O_3$), antimony trioxide ($Sb_2O_3$), silicon monoxides (SiO), selenium trioxide ($Se_2O_3$), tin oxide ($SnO_2$), tungsten trioxide ($WO_3$) or combinations thereof. The dielectric material is preferably a metal oxide. It being possible for the metal oxide to be a single oxide or a mixture of oxides, with or without absorbing properties, for example, $TiO_2$, $ZrO_2$, $Fe_2O_3$, $Fe_3O_4$, $Cr_2O_3$ or ZnO, with $TiO_2$ being especially preferred.

It is possible to obtain pigments that are more intense in colour and more transparent by applying, on top of the $TiO_2$ layer, a metal oxide of low refractive index, such as $SiO_2$, $Al_2O_3$, AlOOH, $B_2O_3$ or a mixture thereof, preferably $SiO_2$, and optionally applying a further $TiO_2$ layer on top of the latter layer (EP-A-892832, EP-A-753545, WO93/08237, WO98/53011, WO9812266, WO9838254, WO99/20695, WO00/42111, and EP-A-1213330). Nonlimiting examples of suitable low index dielectric materials that can be used include silicon dioxide ($SiO_2$), aluminum oxide ($Al_2O_3$), and metal fluorides such as magnesium fluoride ($MgF_2$), aluminum fluoride ($AlF_3$), cerium fluoride ($CeF_3$), lanthanum fluoride ($LaF_3$), sodium aluminum fluorides (e.g., $Na_3AlF_6$ or $Na_5Al_3F_{14}$), neodymium fluoride ($NdF_3$), samarium fluoride ($SmF_3$), barium fluoride ($BaF_2$), calcium fluoride ($CaF_2$), lithium fluoride (LiF), combinations thereof, or any other low index material having an index of refraction of about 1.65 or less. For example, organic monomers and polymers can be utilized as low index materials, including dienes or alkenes such as acrylates (e.g., methacrylate), polymers of perfluoroalkenes, polytetrafluoroethylene (TEFLON), polymers of fluorinated ethylene propylene (FEP), parylene, p-xylene, combinations thereof, and the like. Additionally, the foregoing materials include evaporated, condensed and cross-linked transparent acrylate layers, which may be deposited by methods described in U.S. Pat. No. 5,877,895, the disclosure of which is incorporated herein by reference.

Accordingly, preferred interference pigments comprise besides (a) a metal oxide of high refractive index and in addition (b) a metal oxide, or a nonmetal oxide of low refractive index, wherein the difference of the refractive indices is at least 0.1.

Pigments on the basis of porous silicon oxide ($SiO_z$) substrates, which have been coated by a wet chemical method, in the indicated order are particularly preferred:
$TiO_2$ (substrate: silicon oxide; layer: $TiO_2$, preferably in the rutile modification), $(SnO_2)TiO_2$, $Fe_2O_3$, $Fe_3O_4$, $TiFe_2O_5$, $Cr_2O_3$, $ZrO_2$, $Sn(Sb)O_2$, $BiOCl$, $Al_2O_3$, $Ce_2S_3$, $MoS_2$, $Fe_2O_3 \cdot TiO_2$ (substrate: silicon oxide; mixed layer of $Fe_2O_3$ and $TiO_2$). $TiO_2/Fe_2O_3$ (substrate: silicon oxide; first layer: $TiO_2$; second layer: $Fe_2O_3$), $TiO_2$/Berlin blau, $TiO_2/Cr_2O_3$, or $TiO_2/FeTiO_3$. In general the layer thickness ranges from 1 to 1000 nm, preferably from 1 to 300 nm.

In another particularly preferred embodiment the present invention relates to interference pigments containing at least three alternating layers of high and low refractive index, such as, for example, $TiO_2/SiO_2/TiO_2$, $(SnO_2)TiO_2/SiO_2TiO_2$, $TiO_2/SiO_2/TiO_2/SiO_2/TiO_2$ or $TiO_2/SiO_2/Fe_2O_3$: Preferably the layer structure is as follows:
(A) a coating having a refractive index >1.65,
(B) a coating having a refractive index ≦1.65,
(C) a coating having a refractive index >1.65, and
(D) optionally an outer protective layer.

The thickness of the individual layers of high and low refractive index on the base substrate is essential for the optical properties of the pigment. The thickness of the individual layers, especially metal oxide layers, depends on the field of use and is generally 10 to 1000 nm, preferably 15 to 800 nm, in particular 20 to 600 nm.

The thickness of layer (A) is 10 to 550 nm, preferably 15 to 400 nm and, in particular, 20 to 350 nm. The thickness of layer (B) is 10 to 1000 nm, preferably 20 to 800 nm and, in particular, 30 to 600 nm. The thickness of layer (C) is ±0 to 550 nm, preferably 15 to 400 nm and, in particular, 20 to 350 nm.

Particularly suitable materials for layer (A) are metal oxides, metal sulfides, or metal oxide mixtures, such as $TiO_2$, $Fe_2O_3$, $TiFe_2O_5$, $Fe_3O_4$, $BiOCl$, $CoO$, $Co_3O_4$, $Cr_2O_3$, $VO_2$, $V_2O_3$, $Sn(Sb)O_2$, $SnO_2$, $ZrO_2$, iron titanates, iron oxide hydrates, titanium suboxides (reduced titanium species having oxidation states from 2 to <4), bismuth vanadate, cobalt aluminate, and also mixtures or mixed phases of these compounds with one another or with other metal oxides. Metal sulfide coatings are preferably selected from sulfides of tin, silver, lanthanum, rare earth metals, preferably cerium, chromium, molybdenum, tungsten, iron, cobalt and/or nickel.

Particularly suitable materials for layer (B) are metal oxides or the corresponding oxide hydrates, such as $SiO_2$, $MgF_2$, $Al_2O_3$, $AlOOH$, $B_2O_3$ or a mixture thereof, preferably $SiO_2$.

Particularly suitable materials for layer (C) are colorless or colored metal oxides, such as $TiO_2$, $Fe_2O_3$, $TiFe_2O_5$, $Fe_3O_4$, $BiOCl$, $CoO$, $Co_3O_4$, $Cr_2O_3$, $VO_2$, $V_2O_3$, $Sn(Sb)O_2$, $SnO_2$, $ZrO_2$, iron titanates, iron oxide hydrates, titanium suboxides (reduced titanium species having oxidation states from 2 to <4), bismuth vanadate, cobalt aluminate, and also mixtures or mixed phases of these compounds with one another or with other metal oxides. The $TiO_2$ layers can additionally contain an absorbing material, such as carbon, selectively absorbing colorants, selectively absorbing metal cations, can be coated with absorbing material, or can be partially reduced.

Interlayers of absorbing or nonabsorbing materials can be present between layers (A), (B), (C) and (D). The thickness of the interlayers is 1 to 50 nm, preferably 1 to 40 nm and, in particular, 1 to 30 nm.

In this embodiment preferred interference pigments have the following layer structure:

| | | | |
|---|---|---|---|
| porous $SiO_z$ | $TiO_2$ | $SiO_2$ | $TiO_2$ |
| porous $SiO_z$ | $TiO_2$ | $SiO_2$ | $Fe_2O_3$ |
| porous $SiO_z$ | $TiO_2$ | $SiO_2$ | $TiO_2/Fe_2O_3$ |
| porous $SiO_z$ | $TiO_2$ | $SiO_2$ | $(Sn,Sb)O_2$ |
| porous $SiO_z$ | $(Sn,Sb)O_2$ | $SiO_2$ | $TiO_2$ |
| porous $SiO_z$ | $Fe_2O_3$ | $SiO_2$ | $(Sn,Sb)O_2$ |
| porous $SiO_z$ | $TiO_2/Fe_2O_3$ | $SiO_2$ | $TiO_2/Fe_2O_3$ |
| porous $SiO_z$ | $TiO_2$ | $SiO_2$ | $MoS_2$ |
| porous $SiO_z$ | $TiO_2$ | $SiO_2$ | $Cr_2O_3$ |
| porous $SiO_z$ | $Cr_2O_3$ | $SiO_2$ | $TiO_2$ |
| porous $SiO_z$ | $Fe_2O_3$ | $SiO_2$ | $TiO_2$ |
| porous $SiO_z$ | $TiO_2$ | $Al_2O_3$ | $TiO_2$ |
| porous $SiO_z$ | $Fe_2TiO_5$ | $SiO_2$ | $TiO_2$ |
| porous $SiO_z$ | $TiO_2$ | $SiO_2$ | $Fe_2TiO_5/TiO_2$ |
| porous $SiO_z$ | TiO suboxides | $SiO_2$ | TiO suboxides |
| porous $SiO_z$ | $TiO_2$ | $SiO_2$ | $TiO_2 + SiO_2 + TiO_2 +$ Prussian Blue |
| porous $SiO_z$ | $TiO_2$ | $SiO_2$ | $TiO_2 + SiO_2 + TiO_2$ |
| porous $SiO_z$ | $TiO_2 + SiO_2 + TiO_2$ | $SiO_2$ | $TiO_2 + SiO_2 + TiO_2$ |

The pigments of the present invention are characterized by the precisely defined thickness and smooth surface of the thin porous $SiO_z$ flakes. Instead of the transparent porous $SiO_z$ flakes the porous opaque or semi opaque silicon/silicon oxide flakes can be used as substrate for interference pigments.

The metal oxide layers can be applied by CVD (chemical vapor deposition) or by wet chemical coating. The metal oxide layers can be obtained by decomposition of metal carbonyls in the presence of water vapor (relatively low molecular weight metal oxides such as magnetite) or in the presence of oxygen and, where appropriate, water vapor (e.g. nickel oxide and cobalt oxide). The metal oxide layers are especially applied by means of oxidative gaseous phase decomposition of metal carbonyls (e.g. iron pentacarbonyl, chromium hexacarbonyl; EP-A-45 851), by means of hydrolytic gaseous phase decomposition of metal alcoholates (e.g. titanium and zirconium tetra-n- and -iso-propanolate; DE-A-41 40 900) or of metal halides (e.g. titanium tetrachloride; EP-A-338 428), by means of oxidative decomposition of organyl tin compounds (especially alkyl tin compounds such as tetrabutyltin and tetraethyltin, DE-A-44 03 678) or by means of the gaseous phase hydrolysis of organyl silicon compounds (especially di-tert-butoxyacetoxysilane) described in EP-A-668 329, it being possible for the coating operation to be carried out in a fluidized-bed reactor (EP-A-045 851 and EP-A-106 235).

Chromate- and/or vanadate-containing and also $SiO_2$-containing metal oxide layers can be applied in accordance with the passivation methods described in DE-A-42 36 332 and in EP-A-678 561 by means of hydrolytic or oxidative gaseous phase decomposition of oxide-halides of the metals (e.g. $CrO_2Cl_2$, $VOCl_3$), especially of phosphorus oxyhalides (e.g. $POCl_3$), phosphoric and phosphorous acid esters (e.g. di- and tri-methyl and di- and tri-ethyl phosphite) and of amino-group-containing organyl silicon compounds (e.g. 3-aminopropyl-triethoxy- and -trimethoxy-silane).

Layers of oxides of the metals zirconium, titanium, iron and zinc, oxide hydrates of those metals, iron titanates, titanium suboxides or mixtures thereof are preferably applied by precipitation by a wet chemical method, it being possible, where appropriate, for the metal oxides to be reduced. In the case of the wet chemical coating, the wet chemical coating methods developed for the production of pearlescent pigments may be used; these are described, for example, in DE-A-14 67 468, DE-A-19 59 988, DE-A-20 09 566, DE-A-22 14 545, DE-A-22 15 191, DE-A-22 44 298, DE-A-23 13 331, DE-A-25 22 572, DE-A-31 37 808, DE-A-31 37 809, DE-A-31 51 343, DE-A-31 51 354, DE-A-31 51 355, DE-A-32 11 602 and DE-A-32 35 017, DE 195 99 88, WO 93/08237, WO 98/53001 and WO03/6558.

The metal oxide of high refractive index is preferably $TiO_2$ and/or iron oxide, and the metal oxide of low refractive index is preferably $SiO_2$. Layers of $TiO_2$ can be in the rutile or anastase modification, wherein the rutile modification is preferred. $TiO_2$ layers can also be reduced by known means, for example ammonia, hydrogen, hydrocarbon vapor or mixtures thereof, or metal powders, as described in EP-A-735,114, DE-A-3433657, DE-A4125134, EP-A-332071, EP-A-707, 050 or WO93/19131.

For the purpose of coating, the substrate particles are suspended in water and one or more hydrolysable metal salts are added at a pH suitable for the hydrolysis, which is so selected that the metal oxides or metal oxide hydrates are precipitated directly onto the particles without subsidiary precipitation occurring. The pH is usually kept constant by simultaneously metering in a base. The pigments are then separated off, washed, dried and, where appropriate, calcinated, it being possible to optimise the calcinating temperature with respect to the coating in question. If desired, after individual coatings have been applied, the pigments can be separated off, dried and, where appropriate, calcinated, and then again re-suspended for the purpose of precipitating further layers.

The metal oxide layers are also obtainable, for example, in analogy to a method described in DE-A-195 01 307, by producing the metal oxide layer by controlled hydrolysis of one or more metal acid esters, where appropriate in the presence of an organic solvent and a basic catalyst, by means of a sol-gel process. Suitable basic catalysts are, for example, amines, such as triethylamine, ethylenediamine, tributylamine, dimethylethanolamine and methoxy-propylamine. The organic solvent is a water-miscible organic solvent such as a $C_{1-4}$alcohol, especially isopropanol.

Suitable metal acid esters are selected from alkyl and aryl alcoholates, carboxylates, and carboxyl-radical- or alkyl-radical- or aryl-radical-substituted alkyl alcoholates or carboxylates of vanadium, titanium, zirconium, silicon, aluminum and boron. The use of triisopropyl aluminate, tetraisopropyl titanate, tetraisopropyl zirconate, tetraethyl orthosilicate and triethyl borate is preferred. In addition, acetylacetonates and acetoacetylacetonates of the afore-mentioned metals may be used. Preferred examples of that type of metal acid ester are zirconium acetylacetonate, aluminum acetylacetonate, titanium acetylacetonate and diisobutyloleyl acetoacetylaluminate or diisopropyloleyl acetoacetylacetonate and mixtures of metal acid esters, for example Dynasil® (Hüls), a mixed aluminum/silicon metal acid ester.

As a metal oxide having a high refractive index, titanium dioxide is preferably used, the method described in U.S. Pat. No. 3,553,001 being used, in accordance with an embodiment of the present invention, for application of the titanium dioxide layers.

An aqueous titanium salt solution is slowly added to a suspension of the material being coated, which suspension has been heated to about 50-100° C., especially 70-80° C., and a substantially constant pH value of about from 0.5 to 5, especially about from 1.2 to 2.5, is maintained by simultaneously metering in a base such as, for example, aqueous ammonia solution or aqueous alkali metal hydroxide solution. As soon as the desired layer thickness of precipitated $TiO_2$ has been achieved, the addition of titanium salt solution and base is stopped.

This method, also referred to as the "titration method", is distinguished by the fact that an excess of titanium salt is avoided. That is achieved by feeding in for hydrolysis, per unit time, only that amount which is necessary for even coating with the hydrated $TiO_2$ and which can be taken up per unit time by the available surface of the particles being coated. In principle, the anatase form of $TiO_2$ forms on the surface of the starting pigment. By adding small amounts of $SnO_2$, however, it is possible to force the rutile structure to be formed. For example, as described in WO 93/08237, tin dioxide can be deposited before titanium dioxide precipitation and the product coated with titanium dioxide can be calcined at from 800 to 900° C.

The $TiO_2$ can optionally be reduced by usual procedures: U.S. Pat. No. 4,948,631 ($NH_3$, 750-850° C.), WO93/19131 ($H_2$, >900° C.) or DE-A-19843014 (solid reduction agent, such as, for example, silicon, >600° C.).

Where appropriate, an $SiO_2$ (protective) layer can be applied on top of the titanium dioxide layer, for which the following method may be used: A soda waterglass solution is metered in to a suspension of the material being coated, which suspension has been heated to about 50-100° C., especially 70-80° C. The pH is maintained at from 4 to 10, preferably from 6.5 to 8.5, by simultaneously adding 10% hydrochloric acid. After addition of the waterglass solution, stirring is carried out for 30 minutes.

It is possible to obtain pigments that are more intense in colour and more transparent by applying, on top of the $TiO_2$ layer, a metal oxide of "low" refractive index, that is to say a refractive index smaller than about 1.65, such as $SiO_2$, $Al_2O_3$, AlOOH, $B_2O_3$ or a mixture thereof preferably $SiO_2$, and applying a further $Fe_2O_3$ and/or $TiO_2$ layer on top of the latter layer. Such multi-coated interference pigments comprising a porous silicon oxide substrate or a porous silicon/silicon oxide substrate and alternating metal oxide layers of high and low refractive index can be prepared in analogy to the processes described in WO98/53011 and WO99/20695.

It is, in addition, possible to modify the powder colour of the pigment by applying further layers such as, for example, coloured metal oxides or Berlin Blue, compounds of transition metals, e.g. Fe, Cu, Ni, Co, Cr, or organic compounds such as dyes or colour lakes.

In addition, the pigment according to the invention can also be coated with poorly soluble, firmly adhering, inorganic or organic colourants. Preference is given to the use of colour lakes and, especially, aluminum colour lakes. For that purpose an aluminum hydroxide layer is precipitated, which is, in a second step, laked by using a colour lake (DE-A-24 29 762 and DE 29 28 287).

Furthermore, the pigment according to the invention may also have an additional coating with complex salt pigments, especially cyanoferrate complexes (EP-A-141 173 and DE-A-23 13 332).

According to DE-A4009567 the pigments according to the invention can also be coated with organic dyes, especially phthalocyanine or metal phthalocyanine and/or indanthrene dyes. A suspension of the pigment is produced in a solution of the dye and a solvent is added, in which the dye is insoluble. Furthermore, metal chalcogenides and/or metal chalcogenide hydrates and carbon black can be used for an additional coating.

To enhance the weather and light stability the multiplayer silicon oxide flakes can be, depending on the field of application, subjected to a surface treatment. Useful surface treatments are, for example, described in DE-A-2215191, DE-A-3151354, DE-A-3235017, DE-A-3334598, DE-A-4030727, EP-A-649886, WO97/29059, WO99/57204, and U.S. Pat. No. 5,759,255. Said surface treatment might also facilitate the handling of the pigment, especially its incorporation into various application media.

In the case of multilayer pigments, the interference color is determined by the intensification of certain wavelengths, and if two or more layers in a multilayer pigment have the same optical thickness, the color of the reflected light becomes fuller and more intense as the number of layers increases. In addition to this, it is possible through an appropriate choice of layer thicknesses to achieve a particularly strong variation of the color as a function of the viewing angle. A pronounced color flop is developed, which may be desirable for the pigments according to the invention. Hence, the thickness of the individual metal oxide layers independently of their index of refraction is in the range of from 20 to 500 nm, especially in the range of from 50 bis 300 nm.

The number and thickness of the layers depends on the desired effect. The desired effects are achieved, if the three layer system $TiO_2/SiO_2/TiO_2$ is used and the thickness of the individual layers is optically synchronized to each other. By using optical relative thin $TiO_2$ and $SiO_2$ layers (layer thickness <100 nm) pigments can be produced, which have an essentially lower $TiO_2$ content and a more intense color and are more transparent as pure $TiO_2$/mica pigments. By deposition of thick $SiO_2$ layers (layer thickness >100 nm) pigments having a particularly strong variation of the color as a function of the viewing angle are obtained. By deposition of further $TiO_2$ and $SiO_2$ layers five layer systems or higher layer systems can be obtained, the number of layers is, however, limited by economic aspects. By using of porous $SiO_z$ flakes or porous silicon/silicon oxide flakes of uniform thickness as substrate well defined interference effects can be obtained.

In this case, one receives an interference system by coating the substrate with e.g. 3 layers of the above-mentioned structure of 7 thin layers of a well-defined thickness. The reflection and/or transmission spectrum of such a pigment shows finer and exactly adjustable structures as the spectrum of a corresponding pigment, that is based on a substrate with a broad distribution of thickness, e.g. mica.

These pigments already show with extremely thin $TiO_2$ layers (layer thickness <50 nm) strong interference colors. The angular dependence of the interference color is also especially distinct.

The (effect) pigments according to the invention are characterised by a high gloss and a high uniformity of thickness, whereby a high color purity and a high color strength is achieved.

The (effect) pigments according to the invention can be used for all customary purposes, for example for colouring polymers in the mass, coatings (including effect finishes, including those for the automotive sector) and printing inks (including offset printing, intaglio printing, bronzing and flexographic printing), and also, for example, for applications in cosmetics, in ink-jet printing, for dyeing textiles, glazes for ceramics and glass as well as laser marking of papers and plastics. Such applications are known from reference works, for example "Industrielle Organische Pigmente" (W. Herbst and K. Hunger, VCH Verlagsgesellschaft mbH, Weinheim/New York, 2nd, completely revised edition, 1995).

A process for preparing a matrix material loaded with nanoparticles forms a further subject of the present invention. The process comprises a) vapor-deposition of a separating agent onto a carrier to produce a separating agent layer,
b) then the simultaneous vapor-deposition of a matrix material and a material forming the nanoparticles onto the separating agent layer (a),
c) the separation of the material from the separating agent, in particular by dissolving the separating agent in a solvent, and
d) optionally separation of the matrix material charged with the nanoparticles from the solvent.

The process is carried out fundamentally as the above described process, except that the material forming the matrix and the material forming the nanoparticles is evaporated instead of the material and the separating agent.

In principal, any material can be used as matrix material or nanoparticles forming material which can be evaporated under high vacuum. Preferably, metal oxides and non-metal oxides as well as monomers, oligomers, or polymers are used as matrix materials, which are essentially transparent in the visible region. Advantageously the refractive index of the material loaded with the nanoparticles is similar to the material, in which the material loaded with the nanoparticles is incorporated (for example, coatings, paints, etc.), in order to reduce scattering of light of the material loaded with the nanoparticles. The refractive index of the material charged with the nanoparticles can differ insignificantly, especially by not more than 0.3 units, from the refractive index of the material, in which the material charged with the nanoparticles is incorporated.

In a preferred embodiment of the present invention the matrix material is a nonmetal oxide, especially transparent $SiO_z$ with $1.4 \leq z \leq 2.0$. Such matrix materials are especially suitable as additive in abrasion-resistant (scratch resistant) coatings, since the product remains invisible even in a surface coating having the clarity of water, because the refractive indices are almost the same. The functionality of the $SiO_z$ flakes is determined by the nanoparticles incorporated therein.

The flakes produced in accordance with the process of the present may also be further treated at their surface in accordance with known methods in order to obtain hydrophobic, hydrophilic or antistatic properties or to allow coupling of organic compounds. The plane-parallel structures become oriented parallel to the surface of the coated object and, after subsequent treatment described hereinbelow, form a hard layer close to the surface of the surface coating.

In another preferred embodiment the matrix material is a component of a high molecular weight organic material, especially a paint, a printing ink, or a coating, which are vaporizable in vacuo and can be processed to flakes by the inventive process. Suitable matrix materials should be vaporizable without decomposition and should not react with the nanoparticles incorporated in the matrix. Preferably, the matrix materials should be capable of being used in a continuous PVD method and especially of being vaporised in an industrial context in amounts of more than 1 kg/h with little thermal decomposition. The amounts of non-condensable cracked gases that form should be substantially less than the capacities of the high-vacuum pumps customarily used for such methods. In said embodiment the matrix material is preferably a solid monomer, macromonomer, oligomer or polymer, which is vaporizable in vacuo and is a usual component of a high weight molecular organic material, especially a coating, a paint, or a printing ink. Monomers, for example, acrylate monomers and/or oligomers, can optionally be polymerised thermally or by radiation with electrons and/or light (see, for example, U.S. Pat. No. 5,440,446 and WO98/38255).

Examples of evaporable polymers are polyacrylic acid, polymethacrylic acid, copolymers of acrylic acid and methacrylic acid, copolymers of benzylacrylate and acrylic acid, copolymers of benzylacrylate and methacrylic acid, copolymers of benzylmethacrylate and acrylic acid, copolymers of benzylmethacrylate and methacrylic acid, copolymers of styrene and acrylic acid, copolymers of styrene and methacrylic acid, copolymers of phenethylacrylate and acrylic acid, copolymers of phenethylacrylate and -methacrylat, copolymers of phenethylmethacrylat and acrylic acid and copolymers of phenethylmethacrylat and methacrylic acid, or mixtures thereof. Homopolymers or copolymers are preferred which contain repeating units derived from acrylic acid or methacrylic acid, such as polyacrylic acid, polymethacrylic acid, copolymers of acrylic acid and methacrylic acid, copolymers of benzylacrylate and acrylic acid, copolymers of benzylmethacrylate and acrylic acid, copolymers of benzylmethacrylate and methacrylic acid, copolymers of styrene and acrylic acid, copolymers of styrene and methacrylic acid, copolymers of phenethylacrylate and acrylic acid, copolymers of phenethylacrylate and methacrylic acid, copolymers of phenethylmethacrylate and acrylic acid and copolymers of phenethylmethacrylate and methacrylate (see, for example, DE-A-2706392).

In the two embodiments mentioned above the nanoparticles forming material is preferably an organic pigment or an additive for plastics, paints, coatings, printing inks, or cosmetics, as for example, a UV absorber, or a metal, in particular aluminum, silicon or a noble metal, as silver, gold, palladium, or platinum.

Pigment nanoparticles incorporated in oligomers or polymers can be added as transparent pigments to a high molecular organic material, in particular a paint, without a costly dispersion step, for example, in a ball mill (so-called stirin or "easy dispersable" pigments).

The transparent pigments can be, in particular, used for the preparation of effect varnishes, wood varnishes and for pigmenting transparent plastics.

In another preferred embodiment of the present invention $SiO_y$ as matrix material and TiO as material forming the nanoparticles are vaporized by evaporators heated inductively and evaporators heated with electron beams, respectively. After usual work-up TiO nanoparticles incorporated in a $SiO_y$ matrix are obtained, which can be oxidised in an oxygen containing atmosphere at a temperature above 200° C., whereby titanium oxide nanoparticles incorporated in a $SiO_z$ matrix can be obtained. As described above such particles can be used as highly efficient, transparent, low or hardly photoactive UV absorber.

Luminescent materials, such as, for example, the luminescent materials described in WO02/31060 can also be used as the material forming the nanoparticles. In particular the vaporizable complexes of the formula

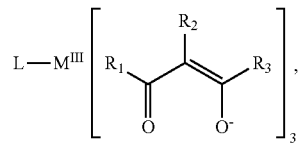

described in EP-A-801652, can be used, wherein
M is Eu, Tb, Dy, or Sm;
$R_2$ is hydrogen, or a $C_1$-$C_6$alkyl group and
$R_1$ and $R_3$ are independently of each other a phenyl group, hydrogen, or a $C_1$-$C_6$alkyl group, and L is p-N,N-dimethylaminopyridine, N-methylimidazole, or p-methoxypyridine-N-oxide.

In a further embodiment the present invention relates to platelike $SiO_{y+a}$ particles (matrix material), containing (1−y/y+a) silicon (nanoparticles), wherein $0.70 \leq y \leq 1.8$, especially $1.0 \leq y \leq 1.8$, $0.05 \leq a \leq 1.30$, and the sum of y and a is smaller or equal to 2.

In this case the matrix material and the material forming the nanoparticles is $SiO_y$ with $0.70 \leq y \leq 1.8$. $SiO_{y+a}$ flakes, especially $SiO_2$ flakes containing (1−y/y+a) Si nanoparticles can be obtained by heating $SiO_y$ particles in an oxygen-free atmosphere, i.e. an argon or helium atmosphere or in a vacuum of less than 13 Pa ($10^{-1}$ Torr), at a temperature above 400° C., especially 400 to 1100° C.

It is assumed that by heating $SiO_y$ particles in an oxygen-free atmosphere, $SiO_y$ disproportionates in $SiO_2$ and Si:

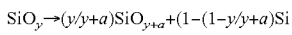

In this disproportion $SiO_{y+a}$ flakes are formed, containing (1−(y/y+a)) Si, wherein $0.70 \leq y \leq 1.8$, especially $0.70 \leq y \leq 0.99$ or $1 \leq y \leq 1.8$, $0.05 \leq a \leq 1.30$, and the sum y and a is equal or less than 2. $SiO_{y+a}$ is an oxygen enriched silicon suboxide. The complete conversion of $SiO_y$ in Si and $SiO_2$ is preferred:

In the temperature range of from 400 to 900° C. the formed silicon is amorph. In the temperature range of from 900 to 1100° C. silicon crystallites are formed. The average crystallite size is in the range of from 1 to 20 nm, especially 2 to 10 nm. The size is on the one hand dependent on the temperature. That is, at 1100° C. larger crystallites than at 900° C. are formed. On the other hand a clear tendency for the formation of smaller crystallites is found, the higher the oxygen level of the $SiO_y$ is. Depending on the preparation the Si containing, plane-parallel $SiO_{y+a}$ particles, especially $SiO_2$ particles can show photoluminescence.

The silicon nanoparticles containing $SiO_y$ flakes are obtained by the process described above, wherein in step b) only one material, namely $SiO_y$, is evaporated.

The silicon nanoparticles containing $SiO_{y+a}$ flakes can, for example, be used as substrate for effect pigments. Accordingly, a further subject of the present invention is formed by platelike pigments, comprising a $SiO_{y+a}$ layer containing silicon nanoparticles, wherein the $SiO_{y+a}$ layer preferably forms the core of the pigment.

The further layers necessary for interferences can be deposited in accordance with usual procedures known for effect pigments with mica and/or $SiO_2$ core, which have been described in more detail above by means of the porous $SiO_z$ flakes.

Metallic or non-metallic, inorganic platelet-shaped particles or pigments are effect pigments, (especially metal effect pigments or interference pigments), that is to say, pigments that, besides imparting colour to an application medium, impart additional properties, for example angle dependency of the colour (flop), lustre (not surface gloss) or texture. On metal effect pigments, substantially oriented reflection occurs at directionally oriented pigment particles. In the case of interference pigments, the colour-imparting effect is due to the phenomenon of interference of light in thin, highly refractive layers.

The (effect) pigments according to the invention can be used for all customary purposes, for example for colouring polymers in the mass, coatings (including effect finishes, including those for the automotive sector) and printing inks (including offset printing, intaglio printing, bronzing and flexographic printing; see, for example, PCT/EP03/50690), and also, for example, for applications in cosmetics (see, for example, PCT/EP03/09269), in ink-jet printing (see, for example, PCT/EP03/50690), for dyeing textiles (see, for example, PCT/EP03/11188), glazes for ceramics and glass as well as laser marking of papers and plastics. Such applications are known from reference works, for example "Industrielle Organische Pigmente" (W. Herbst and K. Hunger, VCH Verlagsgesellschaft mbH, Weinheim/New York, 2nd, completely revised edition, 1995).

When the interference pigments are goniochromatic and result in brilliant, highly saturated (lustrous) colours, they are suitable for combination with conventional, transparent pigments, for example organic pigments such as, for example, diketopyrrolopyrroles, quinacridones, dioxazines, perylenes, isoindolinones etc., it being possible for the transparent pigment to have a similar colour to the effect pigment. Especially interesting combination effects are obtained, however, in analogy to, for example, EP-A-388 932 or EP-A-402 943, when the colour of the transparent pigment and that of the effect pigment are complementary. The pigments according to the invention can be used with excellent results for pigmenting high molecular weight organic material.

The high molecular weight organic material for the pigmenting of which the pigments or pigment compositions according to the invention may be used may be of natural or synthetic origin. High molecular weight organic materials usually have molecular weights of about from $10^3$ to $10^8$ g/mol or even more. They may be, for example, natural resins, drying oils, rubber or casein, or natural substances derived therefrom, such as chlorinated rubber, oil-modified alkyd resins, viscose, cellulose ethers or esters, such as ethylcellulose, cellulose acetate, cellulose propionate, cellulose acetobutyrate or nitrocellulose, but especially totally synthetic organic polymers (thermosetting plastics and thermoplastics), as are obtained by polymerisation, polycondensation or polyaddition. From the class of the polymerisation resins there may be mentioned, especially, polyolefins, such as polyethylene, polypropylene or polyisobutylene, and also substituted polyolefins, such as polymerisation products of vinyl chloride, vinyl acetate, styrene, acrylonitrile, acrylic acid esters, methacrylic acid esters or butadiene, and also copolymerisation products of the said monomers, such as especially ABS or EVA.

From the series of the polyaddition resins and polycondensation resins there may be mentioned, for example, condensation products of formaldehyde with phenols, so-called phenoplasts, and condensation products of formaldehyde with urea, thiourea or melamine, so-called aminoplasts, and the polyesters used as surface-coating resins, either saturated, such as alkyd resins, or unsaturated, such as maleate resins; also linear polyesters and polyamides, polyurethanes or silicones. The said high molecular weight compounds may be present singly or in mixtures, in the form of plastic masses or melts. They may also be present in the form of their monomers or in the polymerised state in dissolved form as film-formers or binders for coatings or printing inks, such as, for example, boiled linseed oil, nitrocellulose, alkyd resins, melamine resins and urea-formaldehyde resins or acrylic resins.

Depending on the intended purpose, it has proved advantageous to use the effect pigments according to the invention as toners or in the form of preparations. Depending on the conditioning method or intended application, it may be advantageous to add certain amounts of texture-improving agents to the effect pigment before or after the conditioning process, provided that this has no adverse effect on use of the effect pigments for colouring high molecular weight organic materials, especially polyethylene. Suitable agents are, especially, fatty acids containing at least 18 carbon atoms, for example stearic or behenic acid, or amides or metal salts thereof, especially magnesium salts, and also plasticizers, waxes, resin acids, such as abietic acid, rosin soap, alkylphenols or aliphatic alcohols, such as stearyl alcohol, or aliphatic 1,2-dihydroxy compounds containing from 8 to 22 carbon atoms, such as 1,2-dodecanediol, and also modified colophonium maleate resins or fumaric acid colophonium resins. The texture-improving agents are added in amounts of preferably from 0.1 to 30% by weight, especially from 2 to 15% by weight, based on the end product. The (effect) pigments according to the invention can be added in any tinctorially effective amount to the high molecular weight organic material being pigmented. A pigmented substance composition comprising a high molecular weight organic material and from 0.01 to 80% by weight, preferably from 0.1 to 30% by weight, based on the high molecular weight organic material, of an pigment according to the invention is advantageous. Concentrations of from 1 to 20% by weight, especially of about 10% by weight, can often be used in practice.

High concentrations, for example those above 30% by weight, are usually in the form of concentrates ("masterbatches") which can be used as colorants for producing pigmented materials having a relatively low pigment content, the pigments according to the invention having an extraordinarily low viscosity in customary formulations so that they can still be processed well.

For the purpose of pigmenting organic materials, the effect pigments according to the invention may be used singly. It is, however, also possible, in order to achieve different hues or colour effects, to add any desired amounts of other colour-imparting constituents, such as white, coloured, black or effect pigments, to the high molecular weight organic substances in addition to the effect pigments according to the invention. When coloured pigments are used in admixture with the effect pigments according to the invention, the total amount is preferably from 0.1 to 10% by weight, based on the high molecular weight organic material. Especially high goniochromicity is provided by the preferred combination of an effect pigment according to the invention with a coloured pigment of another colour, especially of a complementary colour, with colorations made using the effect pigment and colorations made using the coloured pigment having, at a measurement angle of 10°, a difference in hue ($\Delta H^*$) of from 20 to 340, especially from 150 to 210.

Preferably, the effect pigments according to the invention are combined with transparent coloured pigments, it being possible for the transparent coloured pigments to be present either in the same medium as the effect pigments according to the invention or in a neighbouring medium. An example of an arrangement in which the effect pigment and the coloured pigment are advantageously present in neighbouring media is a multi-layer effect coating.

The pigmenting of high molecular weight organic substances with the pigments according to the invention is carried out, for example, by admixing such a pigment, where appropriate in the form of a masterbatch, with the substrates using roll mills or mixing or grinding apparatuses. The pigmented material is then brought into the desired final form using methods known per se, such as calendering, compression moulding, extrusion, coating, pouring or injection moulding. Any additives customary in the plastics industry, such as plasticizers, fillers or stabilisers, can be added to the polymer, in customary amounts, before or after incorporation of the pigment. In particular, in order to produce non-rigid shaped articles or to reduce their brittleness, it is desirable to add plasticizers, for example esters of phosphoric acid, phthalic acid or sebacic acid, to the high molecular weight compounds prior to shaping.

For pigmenting coatings and printing inks, the high molecular weight organic materials and the effect pigments according to the invention, where appropriate together with customary additives such as, for example, fillers, other pigments, siccatives or plasticizers, are finely dispersed or dissolved in the same organic solvent or solvent mixture, it being possible for the individual components to be dissolved or dispersed separately or for a number of components to be dissolved or dispersed together, and only thereafter for all the components to be brought together.

Dispersing an effect pigment according to the invention in the high molecular weight organic material being pigmented, and processing a pigment composition according to the invention, are preferably carried out subject to conditions under which only relatively weak shear forces occur so that the effect pigment is not broken up into smaller portions.

Plastics comprising the pigment of the invention in amounts of 0.1 to 50% by weight, in particular 0.5 to 7% by weight. In the coating sector, the pigments of the invention are employed in amounts of 0.1 to 10% by weight. In the pigmentation of binder systems, for example for paints and printing inks for intaglio, offset or screen printing, the pigment is incorporated into the printing ink in amounts of 0.1 to 50% by weight, preferably 5 to 30% by weight and in particular 8 to 15% by weight.

The colorations obtained, for example in plastics, coatings or printing inks, especially in coatings or printing inks, more especially in coatings, are distinguished by excellent properties, especially by extremely high saturation, outstanding fastness properties, high color purity and high goniochromicity.

When the high molecular weight material being pigmented is a coating, it is especially a specialty coating, very especially an automotive finish.

The effect pigments according to the invention are also suitable for making-up the lips or the skin and for colouring the hair or the nails.

The invention accordingly relates also to a cosmetic preparation or formulation comprising from 0.0001 to 90% by weight of a pigment, especially an effect pigment, according to the invention and from 10 to 99.9999% of a cosmetically suitable carrier material, based on the total weight of the cosmetic preparation or formulation.

Such cosmetic preparations or formulations are, for example, lipsticks, blushers, foundations, nail varnishes and hair shampoos.

The pigments may be used singly or in the form of mixtures. It is, in addition, possible to use pigments according to the invention together with other pigments and/or colorants, for example in combinations as described hereinbefore or as known in cosmetic preparations. The cosmetic preparations and formulations according to the invention preferably contain the pigment according to the invention in an amount from 0.005 to 50% by weight, based on the total weight of the preparation.

Suitable carrier materials for the cosmetic preparations and formulations according to the invention include the customary materials used in such compositions. The cosmetic preparations and formulations according to the invention may be in the form of, for example, sticks, ointments, creams, emulsions, suspensions, dispersions, powders or solutions. They are, for example, lipsticks, mascara preparations, blushers, eye-shadows, foundations, eyeliners, powder or nail varnishes.

If the preparations are in the form of sticks, for example lipsticks, eye-shadows, blushers or foundations, the preparations consist for a considerable part of fatty components, which may consist of one or more waxes, for example ozokerite, lanolin, lanolin alcohol, hydrogenated lanolin, acetylated lanolin, lanolin wax, beeswax, candelillia wax, microcrystalline wax, carnauba wax, cetyl alcohol, stearyl alcohol, cocoa butter, lanolin fatty acids, petrolatum, petroleum jelly, mono-, di- or tri-glycerides or fatty esters thereof that are solid at 25° C., silicone waxes, such as methyloctadecane-oxypolysiloxane and poly(dimethylsiloxy)-stearoxysiloxane, stearic acid monoethanolamine, colophane and derivatives thereof, such as glycol abietates and glycerol abietates, hydrogenated oils that are solid at 25° C., sugar glycerides and oleates, myristates, lanolates, stearates and dihydroxystearates of calcium, magnesium, zirconium and aluminum.

The fatty component may also consist of a mixture of at least one wax and at least one oil, in which case the following oils, for example, are suitable: paraffin oil, purcelline oil, perhydrosqualene, sweet almond oil, avocado oil, calophyllum oil, castor oil, sesame oil, jojoba oil, mineral oils having a boiling point of about from 310 to 410° C., silicone oils, such as dimethylpolysiloxane, linoleyl alcohol, linolenyl alcohol, oleyl alcohol, cereal grain oils, such as wheatgerm oil, isopropyl lanolate, isopropyl palmitate, isopropyl myristate, butyl myristate, cetyl myristate, hexadecyl stearate, butyl stearate, decyl oleate, acetyl glycerides, octanoates and decanoates of alcohols and polyalcohols, for example of glycol and glycerol, ricinoleates of alcohols and polyalcohols, for example of cetyl alcohol, isostearyl alcohol, isocetyl lanolate, isopropyl adipate, hexyl laurate and octyl dodecanol.

The fatty components in such preparations in the form of sticks may generally constitute up to 99.91% by weight of the total weight of the preparation. The cosmetic preparations and formulations according to the invention may additionally comprise further constituents, such as, for example, glycols, polyethylene glycols, polypropylene glycols, monoalkanolamides, non-coloured polymeric, inorganic or organic fillers, preservatives, UV filters or other adjuvants and additives customary in cosmetics, for example a natural or synthetic or partially synthetic di- or tri-glyceride, a mineral oil, a silicone oil, a wax, a fatty alcohol, a Guerbet alcohol or ester thereof, a lipophilic functional cosmetic active ingredient, including sun-protection filters, or a mixture of such substances.

A lipophilic functional cosmetic active ingredient suitable for skin cosmetics, an active ingredient composition or an active ingredient extract is an ingredient or a mixture of ingredients that is approved for dermal or topical application.

The following may be mentioned by way of example:
- active ingredients having a cleansing action on the skin surface and the hair; these include all substances that serve to cleanse the skin, such as oils, soaps, synthetic detergents and solid substances;
- active ingredients having a deodorizing and perspiration-inhibiting action: they include antiperspirants based on aluminum salts or zinc salts, deodorants comprising bactericidal or bacteriostatic deodorizing substances, for example triclosan, hexachlorophene, alcohols and cationic substances, such as, for example, quaternary ammonium salts, and odour absorbers, for example Grillocin® (combination of zinc ricinoleate and various additives) or triethyl citrate (optionally in combination with an antioxidant, such as, for example, butyl hydroxytoluene) or ion-exchange resins;
- active ingredients that offer protection against sunlight (UV filters): suitable active ingredients are filter substances (sunscreens) that are able to absorb UV radiation from sunlight and convert it into heat; depending on the desired action, the following light-protection agents are preferred: light-protection agents that selectively absorb sunburn-causing high-energy UV radiation in the range of approximately from 280 to 315 nm (UV-B absorbers) and transmit the longer-wavelength range of, for example, from 315 to 400 nm (UV-A range), as well as light-protection agents that absorb only the longer-wavelength radiation of the UV-A range of from 315 to 400 nm (UV-A absorbers);
- suitable light-protection agents are, for example, organic UV absorbers from the class of the p-aminobenzoic acid derivatives, salicylic acid derivatives, benzophenone derivatives, dibenzoylmethane derivatives, diphenyl acrylate derivatives, benzofuran derivatives, polymeric UV absorbers comprising one or more organosilicon radicals, cinnamic acid derivatives, camphor derivatives, trianilino-s-triazine derivatives, phenyl-benzimidazolesulfonic acid and salts thereof, menthyl anthranilates, benzotriazole derivatives, and/or an inorganic micropigment selected from aluminum oxide- or silicon dioxide-coated $TiO_2$, zinc oxide or mica;
- active ingredients against insects (repellents) are agents that are intended to prevent insects from touching the skin and becoming active there; they drive insects away and evaporate slowly; the most frequently used repellent is diethyl toluamide (DEET); other common repellents will be found, for example, in "Pflegekosmetik" (W. Raab and U. Kindl, Gustav-Fischer-Verlag Stuttgart/New York, 1991) on page 161;
- active ingredients for protection against chemical and mechanical influences: these include all substances that form a barrier between the skin and external harmful substances, such as, for example, paraffin oils, silicone oils, vegetable oils, PCL products and lanolin for protection against aqueous solutions, film-forming agents, such as sodium alginate, triethanolamine alginate, polyacrylates, polyvinyl alcohol or cellulose ethers for protection against the effect of organic solvents, or substances based on mineral oils, vegetable oils or silicone oils as "lubricants" for protection against severe mechanical stresses on the skin;
- moisturizing substances: the following substances, for example, are used as moisture-controlling agents (moisturizers): sodium lactate, urea, alcohols, sorbitol, glycerol, propylene glycol, collagen, elastin and hyaluronic acid;
- active ingredients having a keratoplastic effect: benzoyl peroxide, retinoic acid, colloidal sulfur and resorcinol;
- antimicrobial agents, such as, for example, triclosan or quaternary ammonium compounds;
- oily or oil-soluble vitamins or vitamin derivatives that can be applied dermally: for example vitamin A (retinol in the form of the free acid or derivatives thereof), panthenol, pantothenic acid, folic acid, and combinations thereof, vitamin E (tocopherol), vitamin F; essential fatty acids; or niacinamide (nicotinic acid amide);
- vitamin-based placenta extracts: active ingredient compositions comprising especially vitamins A, C, E, $B_1$, $B_2$, $B_6$, $B_{12}$, folic acid and biotin, amino acids and enzymes as well as compounds of the trace elements magnesium, silicon, phosphorus, calcium, manganese, iron or copper;
- skin repair complexes: obtainable from inactivated and disintegrated cultures of bacteria of the bifidus group;
- plants and plant extracts: for example arnica, aloe, beard lichen, ivy, stinging nettle, ginseng, henna, chamomile, marigold, rosemary, sage, horsetail or thyme;
- animal extracts: for example royal jelly, propolis, proteins or thymus extracts;
- cosmetic oils that can be applied dermally: neutral oils of the Miglyol 812 type, apricot kernel oil, avocado oil, babassu oil, cottonseed oil, borage oil, thistle oil, groundnut oil, gamma-oryzanol, rosehip-seed oil, hemp oil, hazelnut oil, blackcurrant-seed oil, jojoba oil, cherry-stone oil, salmon oil, linseed oil, cornseed oil, macadamia nut oil, almond oil, evening primrose oil, mink oil, olive oil, pecan nut oil, peach kernel oil, pistachio nut oil, rape oil, rice-seed oil, castor oil, safflower oil, sesame oil, soybean oil, sunflower oil, tea tree oil, grapeseed oil or wheatgerm oil.

The preparations in stick form are preferably anhydrous but may in certain cases comprise a certain amount of water which, however, in general does not exceed 40% by weight, based on the total weight of the cosmetic preparation.

If the cosmetic preparations and formulations according to the invention are in the form of semi-solid products, that is to say in the form of ointments or creams, they may likewise be anhydrous or aqueous. Such preparations and formulations are, for example, mascaras, eyeliners, foundations, blushers, eye-shadows, or compositions for treating rings under the eyes.

If, on the other hand, such ointments or creams are aqueous, they are especially emulsions of the water-in-oil type or of the oil-in-water type that comprise, apart from the pigment, from 1 to 98.8% by weight of the fatty phase, from 1 to 98.8% by weight of the aqueous phase and from 0.2 to 30% by weight of an emulsifier.

Such ointments and creams may also comprise further conventional additives, such as, for example, perfumes, antioxidants, preservatives, gel-forming agents, UV filters, colorants, pigments, pearlescent agents, non-coloured polymers as well as inorganic or organic fillers.

If the preparations are in the form of a powder, they consist substantially of a mineral or inorganic or organic filler such as, for example, talcum, kaolin, starch, polyethylene powder or polyamide powder, as well as adjuvants such as binders colorants etc.

Such preparations may likewise comprise various adjuvants conventionally employed in cosmetics, such as fragrances, antioxidants, preservatives etc.

If the cosmetic preparations and formulations according to the invention are nail varnishes, they consist essentially of nitrocellulose and a natural or synthetic polymer in the form of a solution in a solvent system, it being possible for the solution to comprise other adjuvants, for example pearlescent agents.

In that embodiment, the coloured polymer is present in an amount of approximately from 0.1 to 5% by weight.

The cosmetic preparations and formulations according to the invention may also be used for colouring the hair, in which case they are used in the form of shampoos, creams or gels that are composed of the base substances conventionally employed in the cosmetics industry and a pigment according to the invention.

The cosmetic preparations and formulations according to the invention are prepared in conventional manner, for example by mixing or stirring the components together, optionally with heating so that the mixtures melt.

The Examples that follow illustrate the invention without limiting the scope thereof. Unless otherwise indicated, percentages and parts are percentages and parts by weight, respectively.

EXAMPLES

Example 1

Two separate evaporators arranged in a vacuum chamber ($<10^{-1}$ Pa) are fed with SiO and NaCl powder, respectively. A rotating carrier to which an aluminum foil is attached mechanically is arranged above the evaporators. A NaCl layer (90 nm) is first sublimated onto the aluminum foil. Then the SiO evaporator is heated and the SiO begins to sublimate while salt is still sublimated. In this manner salt and SiO are sublimated simultaneously onto the NaCl layer. The simultaneous vaporization of salt and SiO is continued until a thickness of 300 nm is achieved. Sublimation is terminated, the aluminum foil of the carrier is removed and immersed into distilled water. The NaCl layer as well as the salt contained in the SiO matrix resolve in water, whereby silicon oxide flakes are obtained. Porous $SiO_2$ flakes can be obtained by heating the silicon oxide flakes in air at a temperature greater than 500° C. for several hours, if the $SiO_y$ has not completely been converted to $SiO_2$ by normal work-up.

FIG. 3 shows an atomic force microscope (AFM) picture of the porous $SiO_2$ flakes of example 1 (BET=712 $m^2/g$). The pore sizes are up to 30 nm.

Example 2

A vacuum chamber is loaded with 2 crucibles which each have an own energy supply. The first crucible is filled with SiO and the second crucible with NaCl. The vaporization rate of the materials can be measured by means of a quartz resonator (oscillator quartz). The evaporators are separated by a flap valve from the rustless steel substrate.

The crucible containing NaCl is heated up until the quartz resonator indicates a vaporization rate of 0.3±0.04 nm/s. The flap valve is opened until a NaCl-Schicht has been sublimated onto the rustless steel substrate having a thickness of 100 nm. The cap is then closed.

While the NaCl crucible is hold at the same temperature, the crucible containing SiO is heated until the oscillator quartz indicates a vaporization rate of 2.8±1.2 nm. The flap valve is then opened. The co-sublimation of NaCl and SiO is continued until a total thickness of 420 nm is achieved. The SiO evaporator is then disconnected, the NaCl evaporator is operated about 100 s and then the flap valve is closed.

The substrate is taken from the vacuum chamber. The salt is dissolved in water, the obtained silicon oxide flakes are washed with water and dried. The analysis by means of high-resolution electron microscopy shows, that the silicon oxide flakes show pores with a diameter of about 10.5 nm.

Porous $SiO_2$ flakes can be obtained by heating the silicon oxide flakes in air at a temperature greater than 500° C. for several hours, if the $SiO_y$ has not completely been converted to $SiO_2$ by normal work-up.

Example 3

0.27 g (4.49 mmol) porous $SiO_2$ obtained in example 1 (BET=712 $m^2/g$) are mixed in a 100 ml round bottom flask under $N_2$ with 10.0 g (52.7 mmol) $TiCl_4$ and stirred over night (17 h) at room temperature with a magnetic stirrer, whereby the $TiCl_4$ reacted with the adsorbed water to form nano-$TiO_2$. The excess of the $TiCl_4$ is removed in vacuo and the solid mass dried in a rotary evaporator at 80° C., p=0.01 mbar. Ca. 0.3 g of a grey powder showing interference colors is obtained.

Elemental Analysis: 0.47% C, 2.23% H, <0.3% Cl, 12.40% Ti, corresponding to a $TiO_2$ content of ca. 20 wt. %.

Example 4

The coating formulations used in this example are described in the table below.

| Ingredient | Description | Sample 1 (inventive) | Sample 2 (comparative) |
|---|---|---|---|
| porous silica flakes of example 1 | silica flakes | 100 | — |
| Sipernat (Degussa AG) | precipitated silica | — | 80 |
| MOX (Degussa AG) | fused silica | — | 20 |
| Celvol (Celanese) | Polyvinylalcohol | 30 | 30 |
| DP6 (Ciba SC) | Polyvinylpyrrolidon (PVP) | 1.3 | 1.3 |

All coatings are applied on an uncoated freesheet (Xerographic paper, distributed by Corporate Express, basis weight 75 $g/m^2$, 21.59 cm×27.94 cm, TAPPI brightness 84) using a hand drawdown coater (K303 Multicoater, RK Print-Coat Instruments) to target a low (3 $g/m^2$) and a high (4.5 $g/m^2$) coatweight.

Due to its high viscosity, the sample 1 has to be made down at lower solids (12%) versus the sample 2 (19%), in order to be able to coat it on the hand drawdown coater.

The coated paper containing sample 1 displays a metallic pearlescent texture.

In addition, the coatings containing sample 1 showed a higher washfastness (Washfastness: drip test as per HP's specifications (2 ml water, 45' angle) to determine:

$\Delta E = \sqrt{\Delta L^{*2} + \Delta a^{*2} + \Delta b^{*2}}$) than the coatings containing sample 2.

Example 5 a) Preparation of Porous Silica Containing Metallic Palladium Nanoparticles 500 mg porous $SiO_2$ (BET 750 $m^2/g$) obtained in analogy to the process described in example 1 and 53 mg of $[(C_6H_4CH_2NMe_2-2)Pd(OAc)(PPh_3)]$ (as described in WO03/13723), a well-defined palladium complex which slowly decomposes upon heating, are mixed in 5 ml xylene.

This mixture is stirred rigorously and heated to reflux under a nitrogen atmosphere, and kept at this temperature for 2 hours. During this period of time the color of the reaction mixture turned black. After cooling to room temperature the porous silica was isolated by filtration and washed once with xylene and three times with diethyl ether. The grey silica was dried in vacuum. 506 mg of grey colored porous silica was obtained. An elemental analysis showed that the material contains 1.75 percent by weight palladium (see FIG. 2, which is an ultrathin section of a porous $SiO_2$ flake loaded with palladium).

b) Suzuki Coupling Using the Immobilized Palladium Catalyst on Porous Silica from Example 5a 190 mg 3-bromoanisole, 183 mg phenyl boronic acid and 275 mg potassium carbonate are mixed in 2 ml xylene. To this is added 27 mg of the catalyst from example 5a (corresponds to 0.5 mol % palladium). The reaction mixture is stirred and heated, under an atmosphere of nitrogen, to a temperature of 130° C. for a period of 2 hours. A GC analysis showed that all starting material is consumed and 3-methoxy biphenyl is formed selectively (100% conversion).

After cooling the reaction mixture to room temperature, the catalyst is isolated by filtration and washed subsequently with xylene, ethanol, water, ethanol and diethyl ether, and dried in vacuum. A second run with this catalyst under the same conditions is performed. A GC analysis of the reaction mixture showed again a high conversion to 3-methoxy biphenyl (>80% conversion).

Example 6

0.600 g porous $SiO_2$ (BET: 660 m²/g) obtained in analogy to the process described in example 1 having a maximum particle size of 40 μm are suspended in 35 ml water and heated in a four-neck flask in an oil bath to 65° C. with stirring. The pH of the suspension is controlled with 1N HCl to 1.4. Then, 24 ml of an aqueous $TiOCl_2$ solution (0.5% Ti) stabilised by conc. HCl are added at 65° C. within 8 hours under an atmosphere of nitrogen. The pH is kept constant at 1.4 by slow addition of an aqueous 2N NaOH solution. After the addition of $TiOCl_2$ has been finished, the suspension is stirred for additional 30 minutes. Then the light-blue suspension is cooled to 25° C., filtered with a 20 μm sieve, washed with water and methanol and dried at 50° C. in vacuo, whereby a light-blue product (BET: 650 m²/g) is obtained. The $TiO_2$ content of the product is ca. 8.2% by weight.

Example 7

500 mg of C.I. Pigment Red 179 are dissolved in 60 g of sulphuric acid (96%) at room temperature and stirred for an hour. 500 mg of porous $SiO_2$ flakes (BET: 700 m²/g) obtained in analogy to the process described in example 1 are added in portions to the dark violet solution portion under stirring. Then the suspension is stirred for 2 hours. Thereafter 60 g of glacial water are slowly added to the suspension under stirring, wherein the pigment is precipitated into the pores of the porous $SiO_2$ and an intensive red colored pigment is obtained. 1000 ml of de-ionized water are added to the red suspension and the obtained suspension is stirred for 30 minutes, filtered, washed with water and dried in vacuo. A red composite pigment is obtained.

Example 8

200 mg of

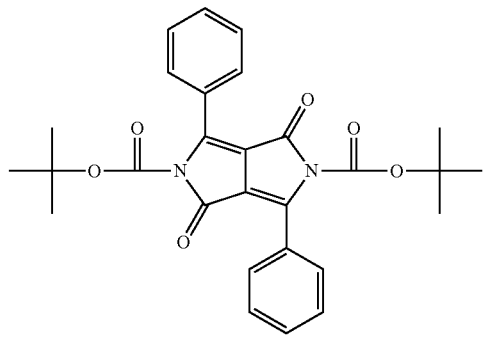

are dissolved in a mixture consisting of 10 g 1-methyl-2-pyrrolidone (NMP) and 25 g of ethanol (99%). To this solution 2 g of porous $SiO_2$ flakes (BET: 700 m²/g) obtained in analogy to the process described in example 1 are added and heated to 60° C. 25 g of ethanol (99%) are added and the suspension is stirred for further 2 h at 60° C. 1000 ml of water are added to the homogenous suspension at 60° C. under stirring within a few seconds, where the latent pigment is precipitated. The yellow orange suspension is cooled to room temperature under stirring, filtered and washed with 1000 g de-ionized water and dried for 16 h at room temperature and subsequently 12 h in a vacuum oven at 100° C. (100 hPa). The slightly pink powder is heated to 180° C. for 20 minutes, where a complete elimination of the BOC groups is achieved. A red composite pigment results.

Example 9

500 mg of porous $SiO_2$ flakes (BET: 700 m²/g) obtained in analogy to the process described in example 1 are suspended in a diluted solution of 4 g $FeCl_3 \times 6H_2O$ in 150 de-ionized water and stirred for 6 h at 50° C. ml. Thereafter a 4% solution of sodium hydroxide is slowly added dropwise under stirring, until a dark brown precipitate results (pH 3.5). The suspension is stirred for 12 h, filtered and the filter cake is rinsed with 4% hydrochloric acid and 1000 g de-ionized water. The golden yellow precipitate is first dried 16 h at room temperature and then 12 h in a vacuum oven at 100° C. (100 hPa). A golden yellow composite-pigment is obtained, which can optionally be calcinated at 700-850° C.

The invention claimed is:
1. A porous $SiO_z$ flake, wherein $0.70 \leq z \leq 2.0$, which flake has a BET specific surface area of greater than 500 m²/g, is characterized by a plane-parallelism and a defined thickness in the range of ±10% of the average thickness, and contain pores which are randomly inter-connected in a three-dimensional way,
    obtained by a process comprising the steps
    a) vapor-deposition of a separating agent onto a carrier to produce a separating agent layer,
    b) the simultaneous vapor-deposition of a material selected from $SiO_z$, Si and a mixture thereof, and a separating agent onto the separating agent layer (a),
    c) the separation of the material from the separating agent.
2. A porous $SiO_z$ flake according to claim 1, wherein in step b of the process consists of the simultaneous vapor-deposition of $SiO_z$, and a separating agent onto the separating agent layer (a).

3. A porous $SiO_z$ flake according to claim 1, wherein in step b of the process, a $SiO_y$/separating agent layer, wherein $0.70 \leq y \leq 1.8$, is vapor-deposited from two different vaporizers, wherein the first vaporiser contains a charge comprising a mixture of Si and $SiO_2$, $SiO_y$, or a mixture thereof, and the second vaporiser containing a charge comprising the separating agent.

4. A porous $SiO_z$ flake according to claim 3, wherein the process comprises a further step wherein the $SiO_y$ is converted to $SiO_z$ with $1.40 \leq z \leq 2.0$ by heating in an oxygen-containing atmosphere, or to $SiO_{y+a}$, containing $(1-(y/y+a))$ silicon, wherein $0.70 \leq y \leq 1.8$, $0.05 \leq a \leq 1.30$, and the sum of y and a is smaller or equal to 2, by heating $SiO_y$ in an oxygen-free atmosphere.

\* \* \* \* \*